(12) United States Patent
Kimura et al.

(10) Patent No.: US 8,519,750 B2
(45) Date of Patent: Aug. 27, 2013

(54) SEMICONDUCTOR SWITCHING DEVICE DRIVE CIRCUIT

(75) Inventors: Tomonori Kimura, Obu (JP); Hisashi Takasu, Nishio (JP)

(73) Assignee: Denso Corporation, Kariya (JP)

( * ) Notice: Subject to any disclaimer, the term of this patent is extended or adjusted under 35 U.S.C. 154(b) by 24 days.

(21) Appl. No.: 13/371,858

(22) Filed: Feb. 13, 2012

(65) Prior Publication Data

US 2012/0206170 A1 Aug. 16, 2012

(30) Foreign Application Priority Data

Feb. 15, 2011 (JP) .................................. 2011-29731

(51) Int. Cl.
*H03B 1/00* (2006.01)
(52) U.S. Cl.
USPC ............ 327/109; 327/110; 327/401; 327/423
(58) Field of Classification Search
USPC ................. 327/108–112, 401, 407–410, 419, 327/423–424, 427–429
See application file for complete search history.

(56) References Cited

U.S. PATENT DOCUMENTS

| | | | | |
|---|---|---|---|---|
| 5,994,929 | A * | 11/1999 | Sano et al. ..................... | 327/111 |
| 6,180,959 | B1 | 1/2001 | Iwasaki et al. | |
| 7,091,753 | B2 | 8/2006 | Inoshita | |
| 7,459,945 | B2 * | 12/2008 | Omura .......................... | 327/108 |
| 2004/0075486 | A1 | 4/2004 | Takehara | |
| 2005/0001659 | A1 | 1/2005 | Inoshita | |
| 2007/0195556 | A1 | 8/2007 | Nakamura et al. | |
| 2008/0122497 | A1 | 5/2008 | Ishikawa et al. | |
| 2010/0295523 | A1 | 11/2010 | Grbovic | |

FOREIGN PATENT DOCUMENTS

| | | |
|---|---|---|
| JP | A-2002-359965 | 12/2002 |
| JP | A-2003-338742 | 11/2003 |
| JP | A-2004-194450 | 7/2004 |
| JP | B2-3572400 | 7/2004 |
| JP | A-2005-12972 | 1/2005 |
| JP | B2-3731562 | 10/2005 |
| JP | A-2007-174134 | 7/2007 |
| JP | A-2010-35387 | 2/2010 |

OTHER PUBLICATIONS

U.S. Appl. No. 13/371,894, filed Feb. 13, 2012, Kimura.
U.S. Appl. No. 13/371,773, filed Feb. 13, 2012, Kimura.
Office Action mailed Jan. 8, 2013 in corresponding JP Application No. 2011-029731 (and English translation).

* cited by examiner

*Primary Examiner* — An Luu
(74) *Attorney, Agent, or Firm* — Posz Law Group, PLC

(57) ABSTRACT

Four energization switching devices and positive/negative switching devices are controlled to form a path charging a positive capacitor; a path connecting a power supply with the positive capacitor in series and energizing an inductor to charge a control terminal of a target switching device; a path charging the control terminal using electromagnetism in the inductor; a path supplying circulating current to the power supply when potential of the control terminal becomes higher than voltage of the power supply; a path charging a negative capacitor; a path connecting the power supply with the negative capacitor in series and energizing the inductor to discharge the control terminal; a path discharging the control terminal using electromagnetism in the inductor; and a path supplying circulating current to the power supply when potential of the control terminal becomes lower than potential of a negative terminal of the power supply.

16 Claims, 24 Drawing Sheets vi: S1 AND S4 TURN OFF TO START DISCHARGING GATE vii: CIRCULATION STARTS IF Vgs > VG AND Vgs IS THEN CLAMPED viii: S3 TURNS ON vi: S2 AND S3 TURN OFF TO START DISCHARGING GATE vii: CIRCULATION STARTS IF Vgs < 0 AND Vgs IS THEN CLAMPED viii: S4 TURNS ON

FIRST EMBODIMENT

DISCHARGE QUANTITY > CHARGE QUANTITY → VOLTAGES OF C1 AND C2 DECREASE

SECOND EMBODIMENT

DISCHARGE QUANTITY < CHARGE QUANTITY → VOLTAGES OF C1 AND C2 INCREASE

S1 TURN-OFF TIMING     S2 TURN-OFF TIMING

ADJUSTING S1 AND S2 TURN-OFF TIMINGS CHANGES
BALANCE BETWEEN DISCHARGE AND CHARGE iv: S1 AND S4 TURN OFF TO START CHARGING GATE v: CIRCULATION STARTS IF Vgs > VG AND Vgs IS THEN CLAMPED vi: S3 TURNS ON AND Sa1 TURNS OFF iv : S2 AND S3 TURN OFF TO START DISCHARGING GATE v : CIRCULATION STARTS IF Vgs < 0 AND Vgs IS THEN CLAMPED vi : S4 TURNS ON AND Sa2 TURNS OFF vii: Sa1 TURNS ON viii: CURRENT L BECOMES ZERO TO COMPLETE TURN-ON OPERATION vii: Sa2 TURNS ON viii: CURRENT L BECOMES ZERO TO COMPLETE TURN-ON OPERATION

DISCHARGE QUANTITY = CHARGE QUANTITY → VOLTAGE MAINTAINED

DISCHARGE QUANTITY < CHARGE QUANTITY → VOLTAGE INCREASES

DISCHARGE QUANTITY > CHARGE QUANTITY → VOLTAGE DECREASES

ADJUSTING Sa1 AND Sa2 TURN-ON TIMINGS
CHANGES BALANCE BETWEEN DISCHARGE AND CHARGE vi : S1 TURNS OFF AND S3 TURNS ON vii : Sa1 TURNS OFF vi : S2 TURNS OFF AND S4 TURNS ON vii : Sa2 TURNS OFF

DISCHARGE QUANTITY = CHARGE QUANTITY → VOLTAGE MAINTAINED

DISCHARGE QUANTITY < CHARGE QUANTITY → VOLTAGE INCREASES

DISCHARGE QUANTITY > CHARGE QUANTITY → VOLTAGE DECREASES

ADJUSTING Sa1 AND Sa2 TURN-OFF TIMINGS
CHANGES BALANCE BETWEEN DISCHARGE AND CHARGE

SEMICONDUCTOR SWITCHING DEVICE DRIVE CIRCUIT

CROSS REFERENCE TO RELATED APPLICATION

This application is based on Japanese Patent Application No. 2011-29731 filed on Feb. 15, 2011, the disclosure of which is incorporated herein by reference.

TECHNICAL FIELD

The present disclosure relates to a drive circuit for driving a switching device having a control terminal applied with a limited drive voltage.

BACKGROUND

Power switching devices such as power MOSFETs are requested to be controlled so as to be normally off in order to ensure safety during operation. Compared to silicon MOSFETs, next-generation devices such as SiC (silicon carbide)-J (junction) FET and GaN (gallium nitride) FET can greatly reduce losses and enable normally-off operation. However, many of these FETs accept up to several voltages (approximately 2 V to 3 V) while an Si power MOSFET can accept a voltage of 10 V to 20 V to the gate. Such devices cannot be driven at a high voltage and therefore make high-speed switching difficult.

As technologies of limiting gate voltages, for example, JP-A-3655049 (see FIG. 11) uses a series circuit of a gate resistor and a zener diode connected between the emitter of a gate drive transistor and the ground. The gate of a static induction transistor is connected to a common connection point of both, allowing a zener voltage to clamp a gate voltage. This configuration allows an electric current to continuously flow through the zener diode while the static induction transistor is turned on. In this configuration, the drive circuit is subject to a large loss and is incapable of switching in a high frequency range.

JP-A-4321330 (see FIG. 14) uses four switching devices to configure a gate drive circuit similar to an H bridge. The bridge circuit allows an inductor to flow a gate current. This enables to fast switch the MOSFET independently of a gate voltage and decrease a loss occurring in the drive circuit.

However, the configuration according to JP-A-4321330 requires a long time to increase a current applied to the inductor and is also incapable of switching in a high frequency range.

SUMMARY

It is an object of the disclosure to provide a semiconductor switching device drive circuit enabling high-frequency and fast switching for a switching device setting a limitation on application of drive voltage.

According to an aspect, a semiconductor switching device drive circuit comprises a drive power supply configured to apply a drive voltage between a potential reference output terminal of a drive-target switching device and a control terminal of the drive-target switching device. The semiconductor switching device drive circuit further comprises a positive-bias-side series circuit including a positive-bias-side switching device and a positive-bias-side diode having an anode, the anode being a common connection point connected to a positive-bias-side terminal of the drive power supply. The semiconductor switching device drive circuit further comprises a negative-bias-side series circuit including a negative-bias-side switching device and a negative-bias-side diode having a cathode, the cathode being a common connection point connected to a negative-bias-side terminal of the drive power supply. The semiconductor switching device drive circuit further comprises a positive-bias-side capacitor connected in parallel with the positive-bias-side series circuit. The semiconductor switching device drive circuit further comprises a negative-bias-side capacitor connected in parallel with the negative-bias-side series circuit. The semiconductor switching device drive circuit further comprises an inductor connected to the control terminal of the drive-target switching device. The semiconductor switching device drive circuit further comprises an energization control circuit including first to fourth energization switching devices each connected to the inductor at one end and each having a free wheel diode connected in parallel in a direction opposite to a polarity of the drive power supply. The energization control circuit is configured to control the first to fourth energization switching devices and the positive-bias-side and negative-bias-side switching devices thereby to form: a first path that charges the positive-bias-side capacitor; a second path that connects the drive power supply with the positive-bias-side capacitor in series and energizes the inductor in a direction to charge the control terminal of the drive-target switching device; a third path that charges the control terminal of the drive-target switching device using an electromagnetic energy stored in the inductor; a fourth path that applies a circulating current to the drive power supply when a potential of the control terminal becomes higher than a voltage of the drive power supply; a fifth path that charges the negative-bias-side capacitor; a sixth path that connects the drive power supply with the negative-bias-side capacitor in series and energizes the inductor in a direction to discharge the control terminal of the drive-target switching device; a seventh path that discharges the control terminal of the drive-target switching device using an electromagnetic energy stored in the inductor; and an eighth path that applies a circulating current to the drive power supply when potential of the control terminal becomes lower than potential at a negative-bias-side terminal of the drive power supply.

BRIEF DESCRIPTION OF THE DRAWINGS

The above and other objects, features and advantages of the present disclosure will become more apparent from the following detailed description made with reference to the accompanying drawings. In the drawings:

FIG. 3 is a view showing a state transition of an energizing path when an N-channel FET is turned on;

DETAILED DESCRIPTION (First Embodiment)

Figure 1:
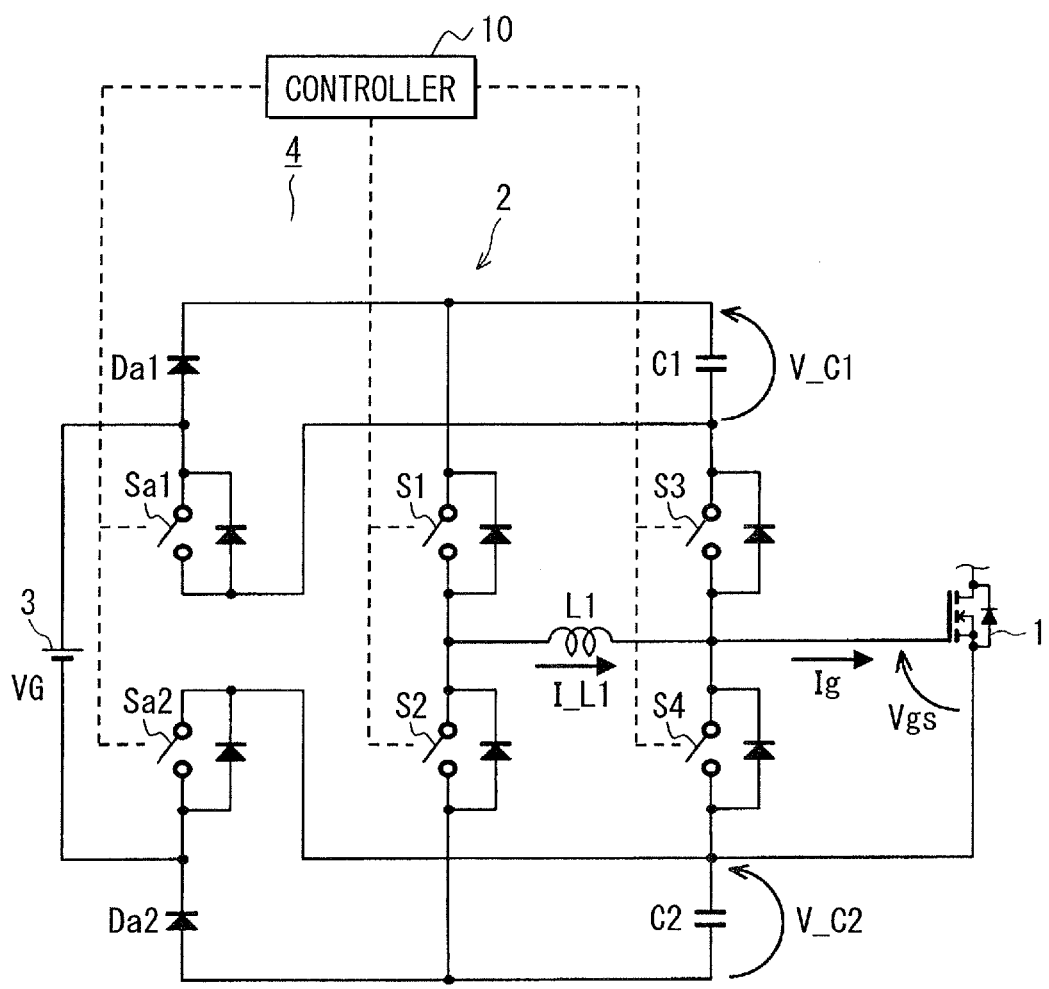
FIG. 1 is a diagram showing an electric configuration of a drive circuit according to a first embodiment.

The following describes a first embodiment with reference to FIGS. 1 to 4. FIG. 1 shows a drive circuit that drives an N-channel FET, for example. An N-channel FET 1 (switching device to be driven) connects with a load (not shown) at the drain. A drive circuit 2 is connected between the gate and the source of the N-channel FET 1 (low-side driving). In the drawing, the N-channel FET 1 is represented with an MOSFET symbol for convenience sake though the FET is not limited to the MOS structure. The drive circuit 2 supplies charge-discharge current Ig to the gate (control terminal) of the N-channel FET 1 as an N-channel MOSFET based on voltage VG supplied from a gate drive power supply 3. A parallel circuit using switch and diode symbols shown in FIG. 1 actually provides an N-channel MOSFET (using a parasitic diode). These symbols are used for ease of description.

The positive-bias-side terminal of the gate drive power supply 3 is connected to a common connection point (anode) for a series circuit including a switch Sa1 (positive-bias-side switching device) and a diode Da1 (positive-bias-side diode). The negative-bias-side terminal is connected to a common connection point (cathode) for a series circuit including a switch Sa2 (negative-bias-side switching device) and a diode Da2 (negative-bias-side diode). Two series circuits are connected between the cathode of the diode Da1 and the anode of the diode Da2. One of the series circuits includes switches S1 and S2 (energization switching devices). The other of the series circuits includes a capacitor C1 (positive-bias-side capacitor), switches S3 and S4 (energization switching devices), and a capacitor C2 (negative-bias-side capacitor).

An inductor L1 is connected between a common connection point of the switches S1 and S2 and a common connection point of the switches S3 and S4. The common connection point of the switches S3 and S4 is connected to the gate of the N-channel FET 1. The source (potential reference output terminal) of the N-channel FET 1 is connected to the negative-bias-side terminal of the gate drive power supply 3. Each of the switches S1 to S4 is connected in parallel with a diode (free wheel diode) that is directed opposite to the polarity of the gate drive power supply 3. A control circuit 10 controls the switches Sa1, Sa2, and S1 to S4 so as to be turned on or off. The switches S1 to S4 and the control circuit 10 configure an energization control circuit 4.

Figure 2:
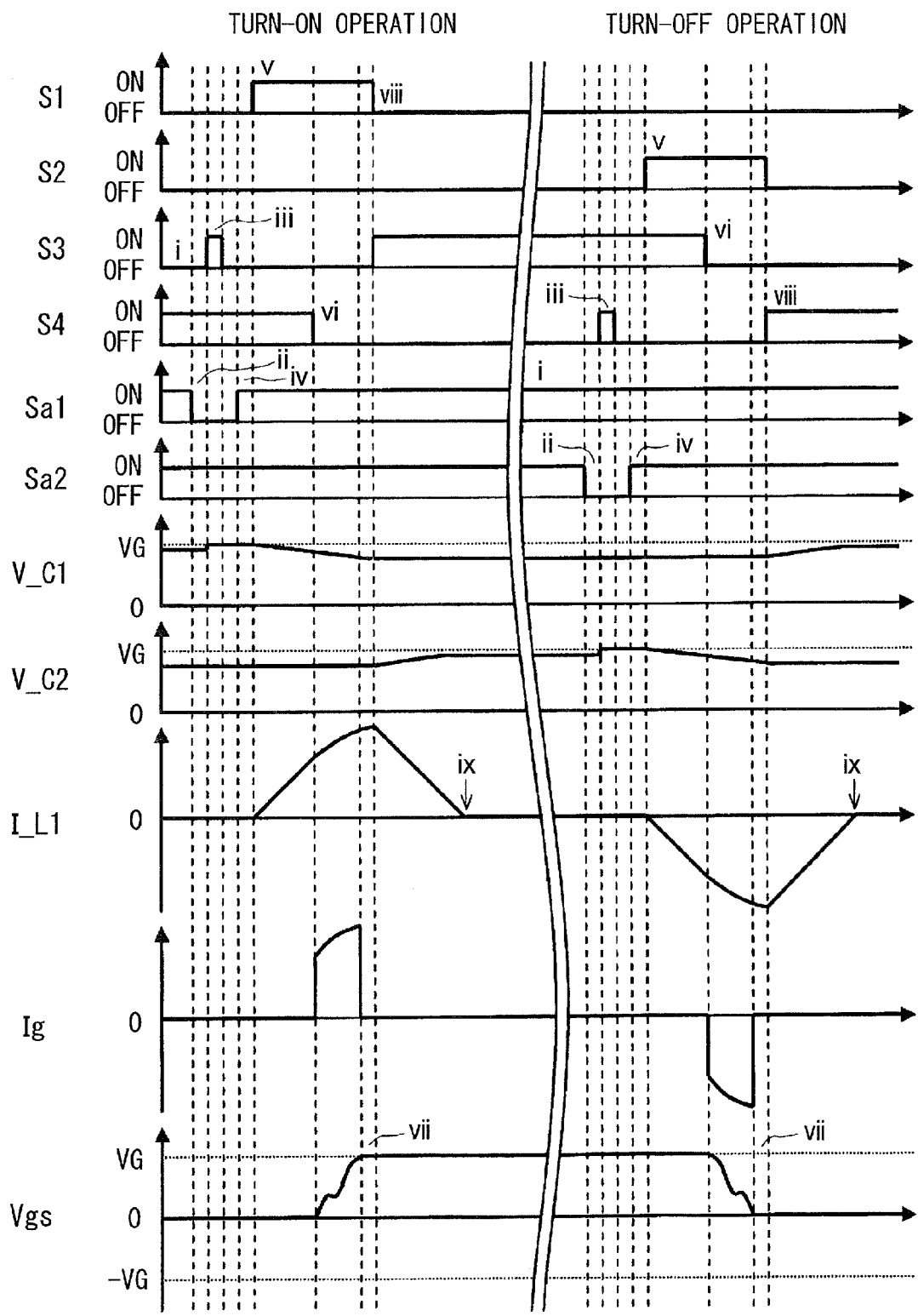
FIG. 2 is a timing chart according to a first embodiment.
Figure 3:
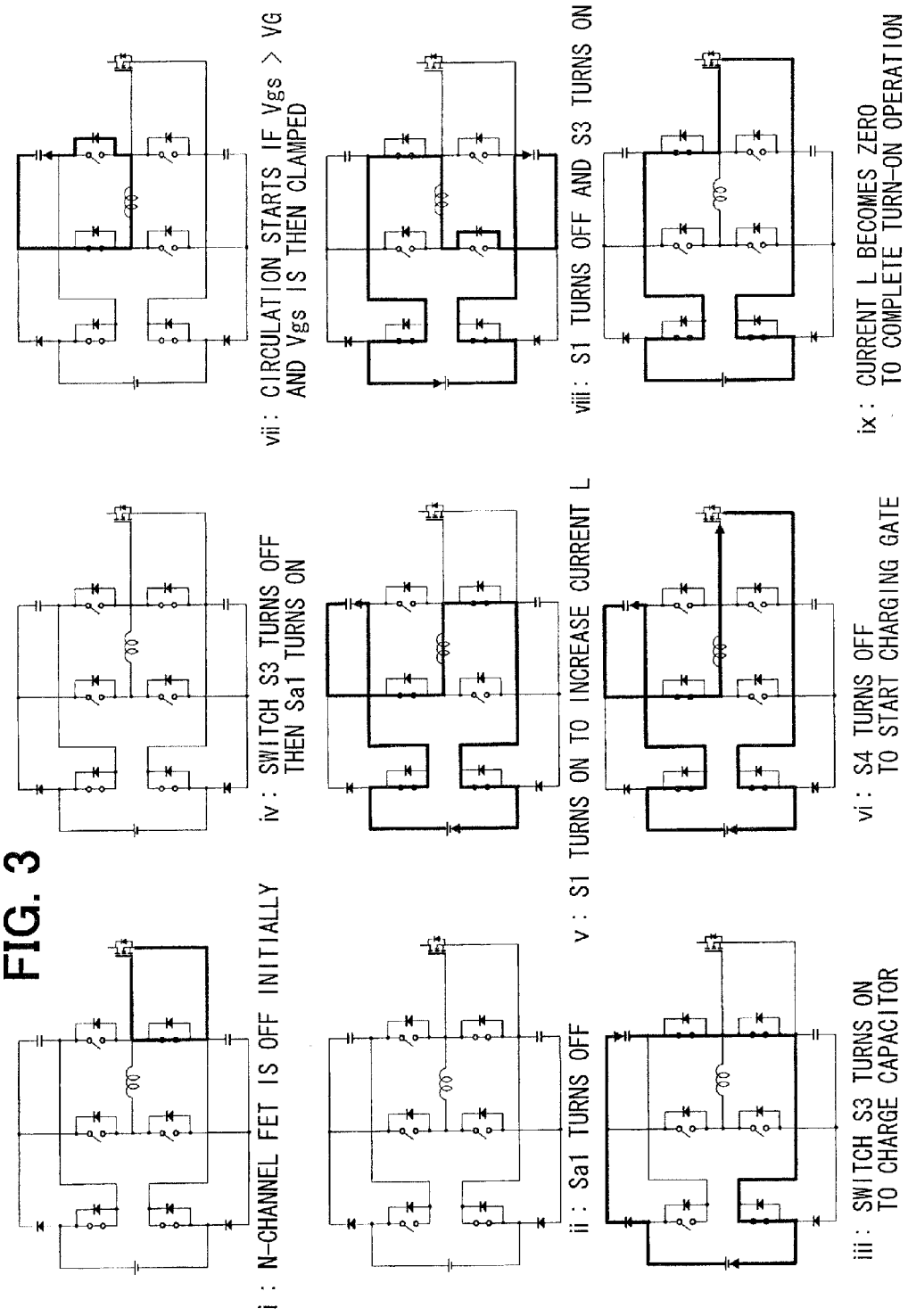
Figure 4:
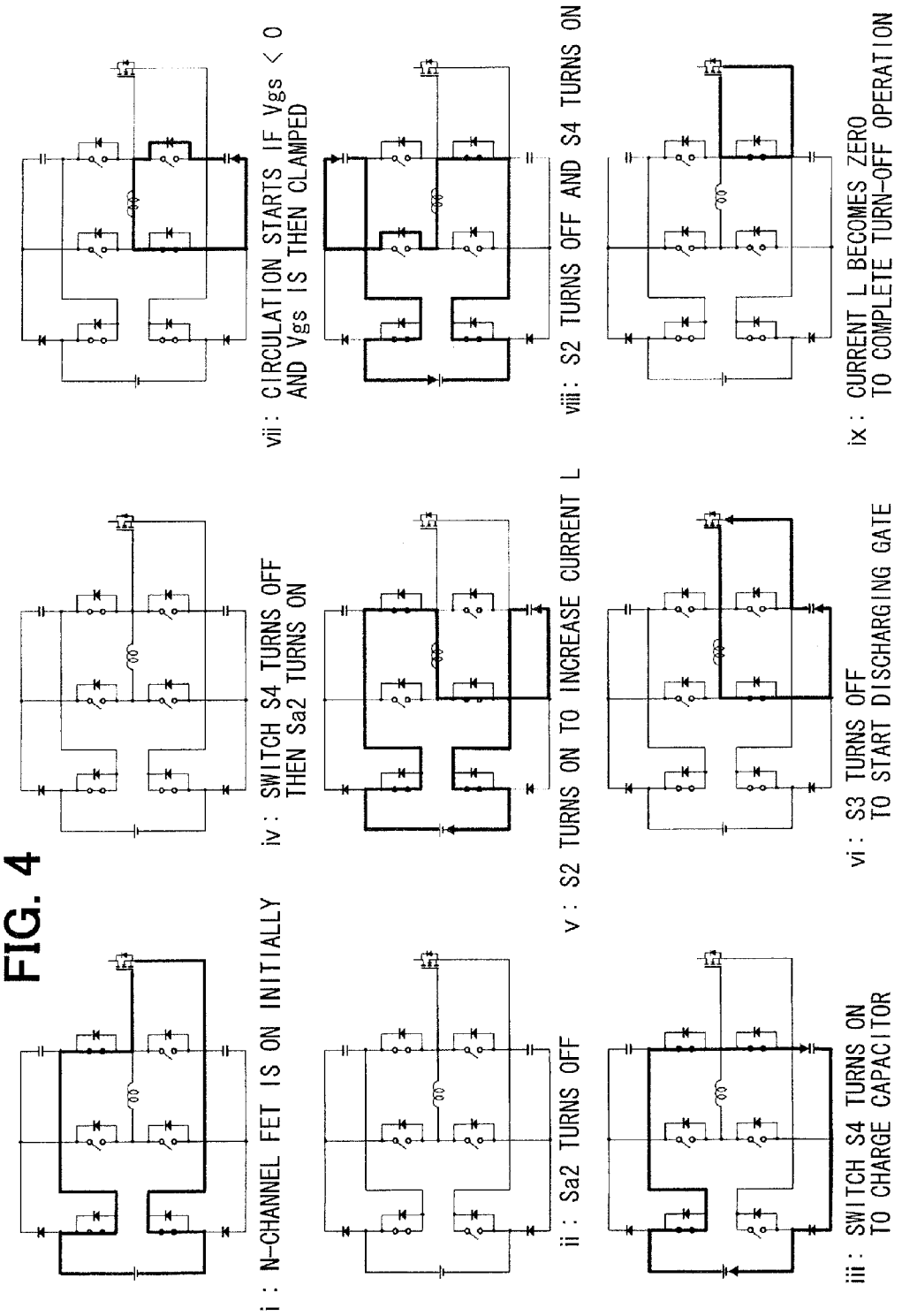
FIG. 4 is a view showing a state transition of the energizing path when the N-channel FET is turned off.

The following describes operations of the embodiment also with reference to FIGS. 2 to 4. FIG. 2 is a timing chart showing on/off operations implemented by the control circuit 10 for the switches Sa1, Sa2, and S1 to S4, and voltage and current waveforms of the components. FIG. 3 shows a sequence of selecting the switches Sa1, Sa2, and S1 to S4 in order to turn on the N-channel FET 1 and corresponding flows of a current.

Turning on the N-channel FET 1

In the following description, parenthesized Roman numerals (1)-(9) denote Greek numerals i-ix in FIGS. 2 to 4. (1) As an initial state in FIG. 3, the switches Sa1, Sa2, and S4 turn on. The gate of the N-channel FET 1 is connected to the potential (e.g., 0 V or ground potential) of the negative-bias-side terminal of the gate drive power supply 3. The N-channel FET 1 is turned off. (2) The switch Sa1 turns off. (3) The switch S3 turns on. An energizing path is then formed from the positive-bias-side terminal of the gate drive power supply 3 to the diode Da1, the capacitor C1, the switches S3, S4, and Sa2, and the negative-bias-side terminal of the gate drive power supply 3. The capacitor C1 is charged to a drive voltage (VG−Vf).

(4) The switch S3 turns off, then the switch Sa1 turns on. (5) The switch S1 turns on. An energizing path is then formed from the positive-bias-side terminal of the gate drive power supply 3 to the switch Sa1, the capacitor C1, the switches S1, S4, and Sa2, and the negative-bias-side terminal of the gate drive power supply. The capacitor C1 is connected to the gate drive power supply 3 in series. Voltage (2VG−Vf) is applied to the inductor L1 to increase current I_L1. (6) The switch S4 is turned off in this state. The current I_L1 is stored in the inductor L1 to accumulate an electromagnetic energy. The current I_L1 is supplied as the current Ig to the gate of the N-channel FET 1 to charge the gate. Gate-source voltage Vgs in the N-channel FET 1 increases and becomes higher than the voltage VG. (7) The current I_L1 then flows through the free wheel diode of the switch S3, the capacitor C1, and the switch S1. As a result, the voltage Vgs is clamped at the voltage VG. (8) In this state, the switch S1 turns off and the switch S3 turns on. The current I_L1 flows through a path from the switches S3 and Sa1, the gate drive power supply 3, the switch Sa2, the capacitor C2, the free wheel diode of the switch S2, and the inductor L1. The current I_L1 is regenerated toward the gate drive power supply 3. (9) Finally, zeroing the current I_L1 turns on the N-channel FET 1.

Turning off the N-channel FET 1

(1) The N-channel FET 1 turns on as described above. (2) The switch Sa2 turns off. (3) The switch S4 turns on. An energizing path is formed from the positive-bias-side terminal of the gate drive power supply 3 to the switches Sa1, S3, and S4, the capacitor C2, the diode Da2, and the negative-bias-side terminal of the gate drive power supply 3. The capacitor C2 is charged to the drive voltage (VG−Vf).

(4) The switch S4 turns off and then the switch Sa2 turns on. (5) The switch S2 turns on. An energizing path is formed from the positive-bias-side terminal of the gate drive power supply 3 to the switches Sa1, S3, and S2, the capacitor C2, the switch Sa2, and the negative-bias-side terminal of the gate drive power supply 3. The capacitor C2 is connected to the gate drive power supply 3 in series. As a result, the voltage (2VG−Vf) is applied to the inductor L1. The current I_L1 increases in the direction opposite to that for the N-channel FET 1 turned on. (6) In this state, turning off the switch S3 allows the current I_L1 to flow as the current Ig from the gate of the N-channel FET 1, discharging the gate.

The gate-source voltage Vgs for the N-channel FET 1 decreases and becomes lower than 0 V. (7) The current I_L1 then flows through the switch S2, the capacitor C2, and the free wheel diode of the switch S4. The voltage Vgs is then clamped at 0 V. (8) In this state, the switch S2 turns off and the switch S4 turns on. The current I_L1 flows through a path from the free wheel diode of the switch S1 to the capacitor C1, the switch Sa1, the gate drive power supply 3, the switches Sa2 and S4, and the inductor L1. The current I_L1 is regenerated toward the gate drive power supply 3. (9) Finally, zeroing the current I_L1 turns off the N-channel FET 1.

According to the present embodiment, the energization control circuit 4 controls the four switches S1 to S4 as well as the switches Sa1 and Sa2. The current is thereby applied to the inductor L1 in both directions. The current flowing through the inductor L1 charges the gate of the N-channel FET 1. The gate is then discharged. More specifically, two series circuits configure the energization control circuit 4. One series circuit includes the switches S1 and S2 connected between the cathode of the diode Da1 and the anode of the diode Da2. The other series circuit includes the switches S3 and S4 that are connected between the capacitors C1 and C2 and have the common connection point connected to the gate of the N-channel FET 1. The inductor L1 is connected between the common connection point of the switches S1 and S2 and the common connection point of the switches S3 and S4. The energization control circuit 4 controls on/off states of the switches Sa1 and Sa2 and the switches S1 to S4 that are connected according to the H-bridge design with reference to the inductor L1. This enables to provide first to eighth energizing paths corresponding to (1) to (8) as described above corresponding to an aspect 1 described later.

(Second Embodiment)

Figure 5:
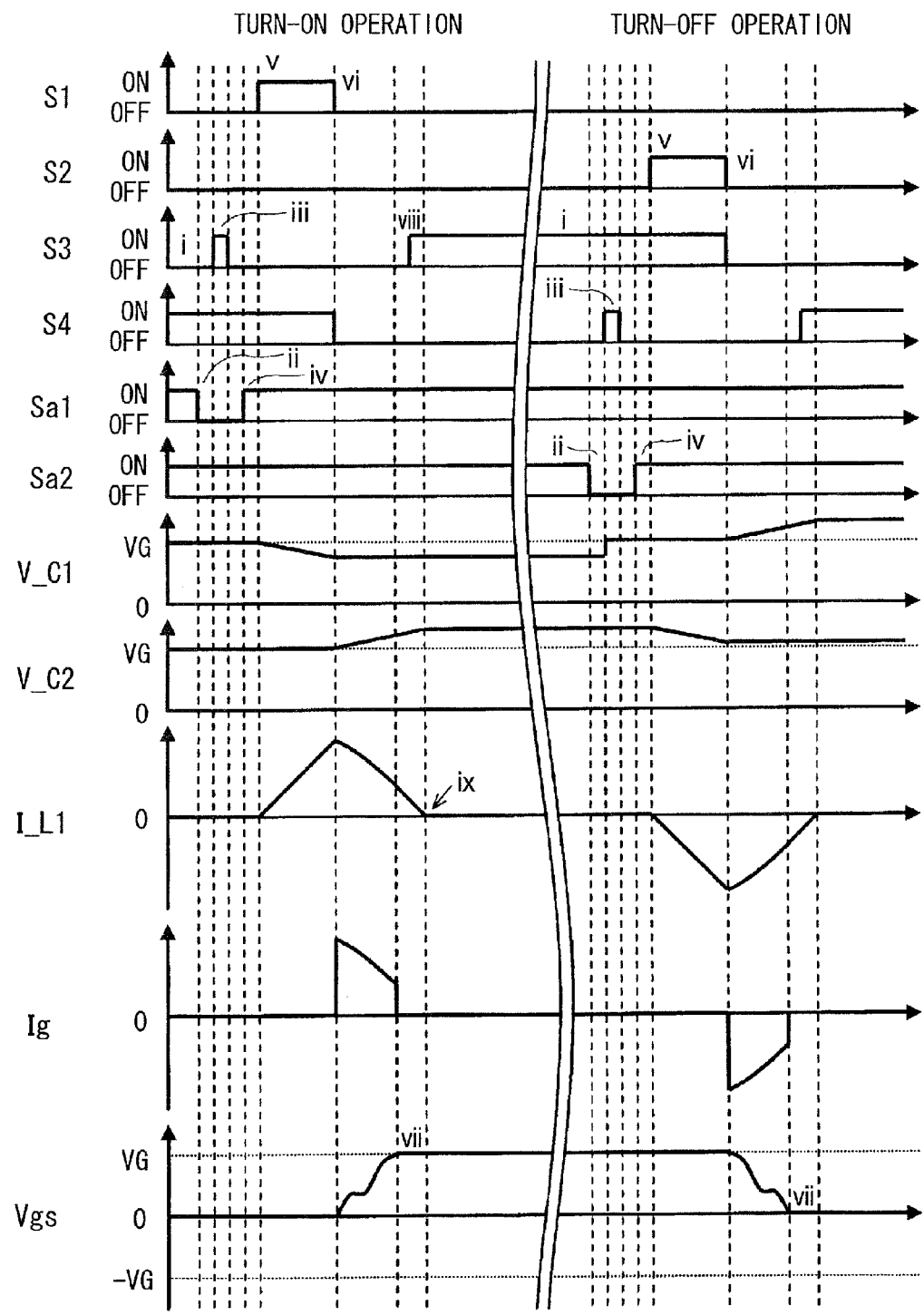
FIG. 5 is a timing chart according to a second embodiment.
Figure 6:
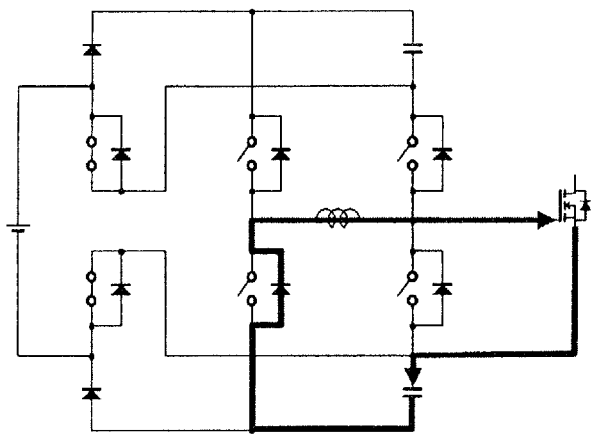
FIG. 6 is a view showing a state transition of an energizing path according to the second embodiment.
Figure 6:
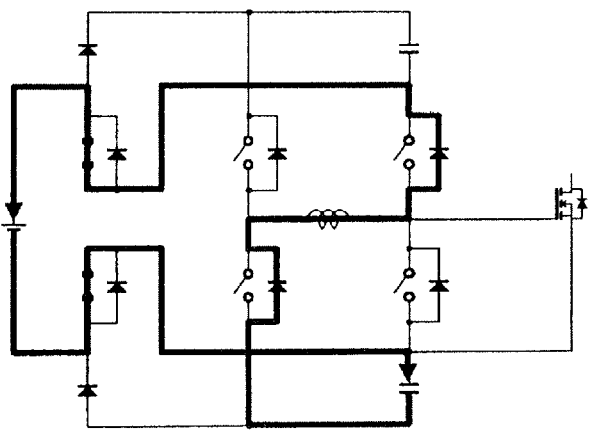
Figure 6:
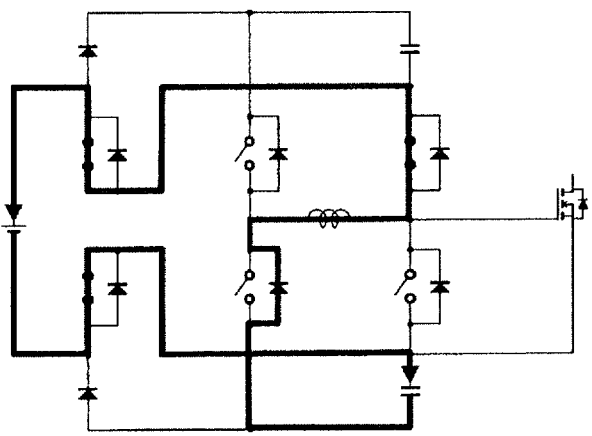
Figure 7:
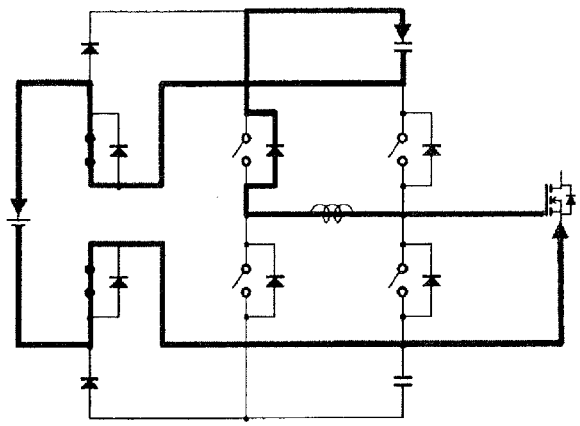
FIG. 7 is a view showing a state transition of the energizing path according to the second embodiment.
Figure 7:
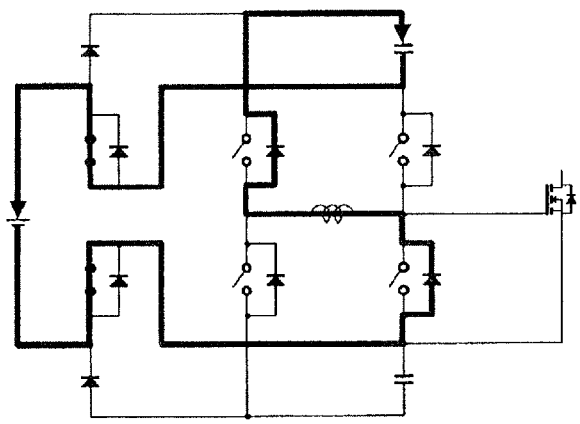
Figure 7:
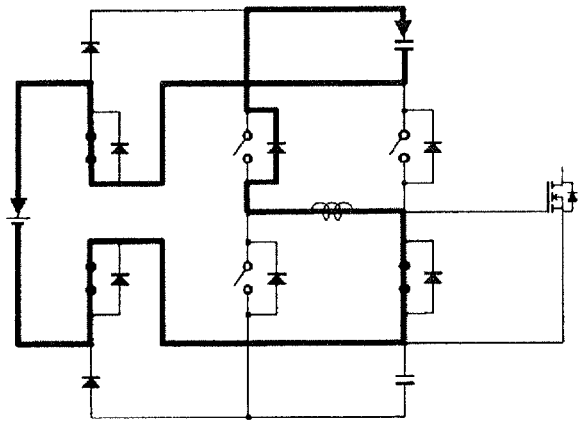

FIGS. 5 to 8A and 8B show a second embodiment. The mutually corresponding parts in the second and first embodiments are designated by the same reference numerals and a detailed description is omitted for simplicity. The following describes differences from those of the first embodiment. The second embodiment has substantially the same configuration as that of the first embodiment and uses different on/off timings for some switches. FIG. 5 is equivalent to FIG. 2. FIGS. 6 and 7 are partially equivalent to FIGS. 3 and 4.

Turning on N-channel FET 1

As seen from FIG. 6, switching patterns (6) and (8) differ from those of the first embodiment. A difference in the switching pattern (6) also changes the energizing path in (7). The switching pattern (6) turns off the switches S4 and S1. In this case, the current I_L1 or Ig to charge the gate of the N-channel FET 1 flows through a path of the inductor L1, the gate-source of the N-channel FET 1, the capacitor C2, and the free wheel diode of the switch S2. The capacitor C2 is then charged. The capacitor C2 is not discharged during the period from (1) to (5). When the capacitor C2 indicates its terminal voltage as VG in this period, the terminal voltage increases over VG at (6).

The gate-source voltage Vgs increases over the voltage VG. (7) The current I_L1 then flows through the free wheel diode of the switch S3, the switch Sa1, the gate drive power supply 3, the switch Sa2, the capacitor C2, and the free wheel diode of the switch S2. The capacitor C2 is charged also at this time. As a result, as shown in FIG. 5, potential V_C2 of the capacitor C2 continues to increase during period (7). In this state, turning on the switch S3 causes the same state as (8) shown in FIG. 3.

Turning off the N-channel FET 1

Also in this case, switching patterns (6) and (8) in FIG. 7 differ from those of the first embodiment. The switching pattern (6) turns off the switches S3 and S2. In this case, the current I_L1 or Ig to discharge the gate of the N-channel FET 1 flows through a path of the inductor L1, the free wheel diode of the switch S1, the capacitor C1, the switch Sa1, the gate drive power supply 3, the switch Sa2, and the source-gage of the N-channel FET 1. The capacitor C1 is then charged.

The gate-source voltage Vgs becomes lower than 0 V. (7) The current I_L1 then flows through the free wheel diode of the switch S1, the capacitor C1, the switch Sa1, the gate drive power supply 3, the switch Sa2, and the free wheel diode of the switch S4. The capacitor C1 is charged also at this time. As a result, as shown in FIG. 5, potential V_C1 of the capacitor C1 increases over the power supply voltage VG. In this state, turning on the switch S4 causes the same state as (8) shown in FIG. 4.

Figure 8A:
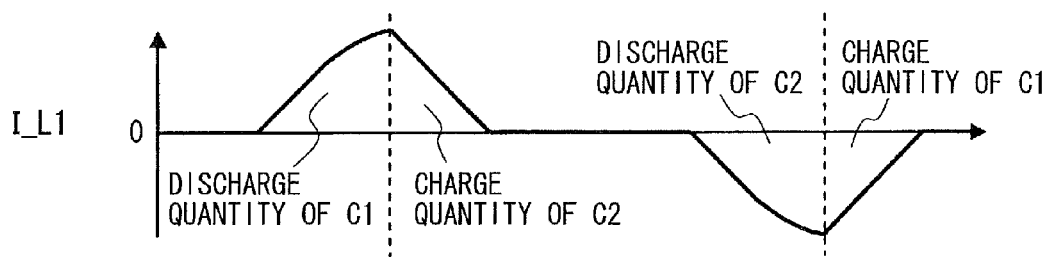
FIGS. 8A and 8B are views each showing a relation between a current supplied to an inductor, a charge quantity, and a discharge quantity of capacitors C1 and C2.
Figure 8B:
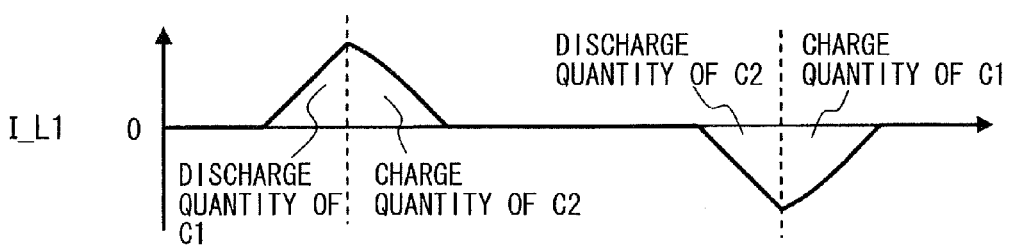

The following describes differences between the first embodiment and the second embodiment with reference to FIGS. 8A and 8B. FIG. 8A shows a waveform of the I_L1 shown in FIG. 2. FIG. 8B shows a waveform of the I_L1 shown in FIG. 5. According to the first embodiment, the current I_L1 increases for a long period and decreases for a short period during the turn-on operation. The long period specifies the discharge quantity of the capacitor C1. The short period specifies the charge quantity of the capacitor C2. Each period corresponds to the integral quantity, that is, an area defined by the waveform.

The negative polarity current I_L1 increases for a long period and decreases for a short period during the turn-off operation. The long period specifies the discharge quantity of the capacitor C2. The short period specifies the charge quantity of the capacitor C1. As a result, the capacitors C1 and C2 both ensure the relation of (discharge quantity)>(charge quantity). The switching patterns according to the first embodiment decrease the terminal voltages V_C1 and V_C2 of the capacitors C1 and C2.

According to the second embodiment, the current I_L1 increases for a short period and decreases for a long period during the turn-on operation. The negative polarity current I_L1 increases for a short period and decreases for a long period during the turn-off operation. As a result, the capacitors C1 and C2 both ensure the relation of (discharge quantity)<(charge quantity). The switching patterns according to the second embodiment increase the terminal voltages V_C1 and V_C2 of the capacitors C1 and C2. The control patterns according to the first and second embodiments may need to be combined in order to adjust and keep constant the terminal voltages V_C1 and V_C2 of the capacitors C1 and C2. This will be described in a following third embodiment.

(Third Embodiment)

Figure 9:
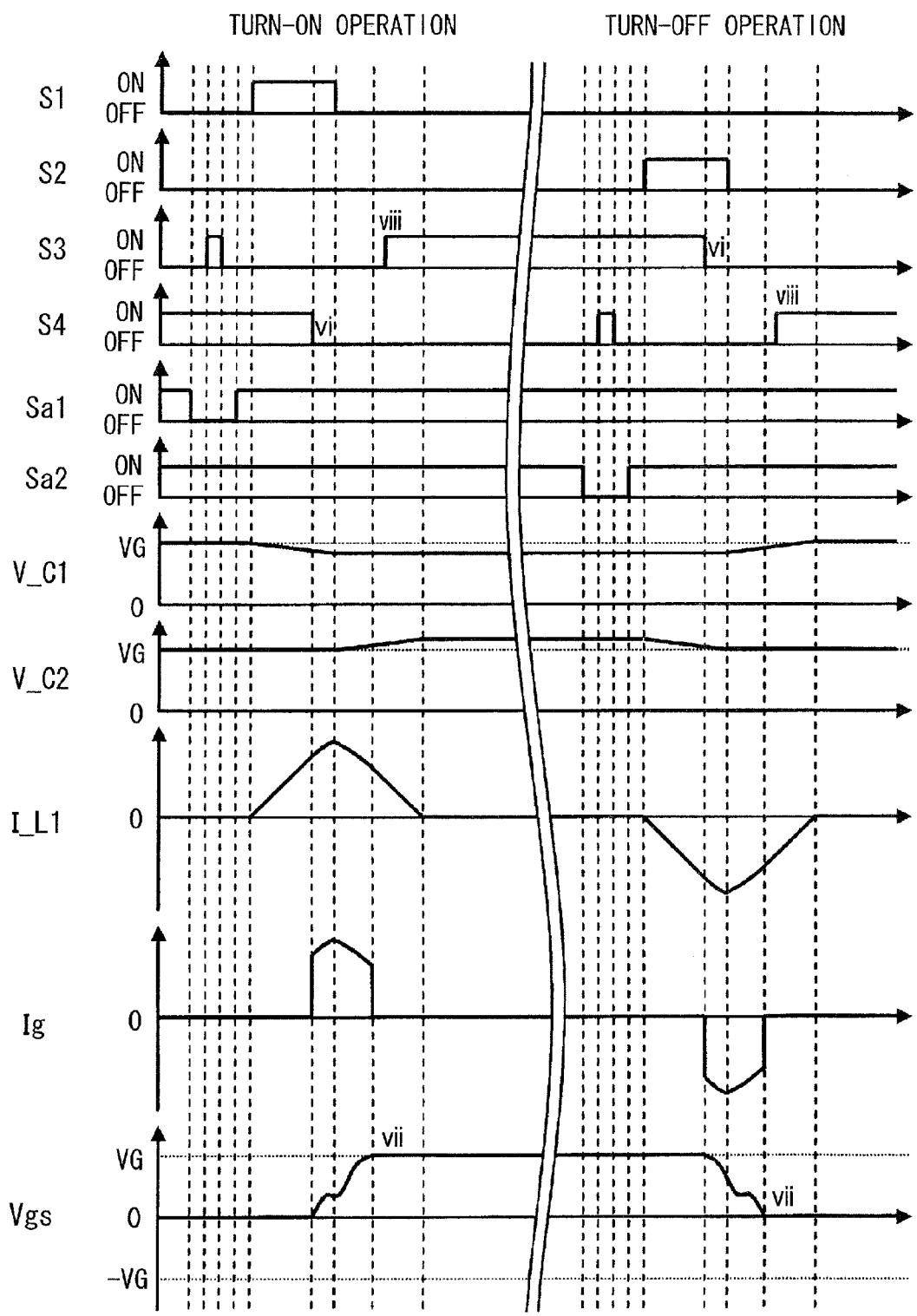
FIG. 9 is a timing chart according to a third embodiment.
Figure 10:
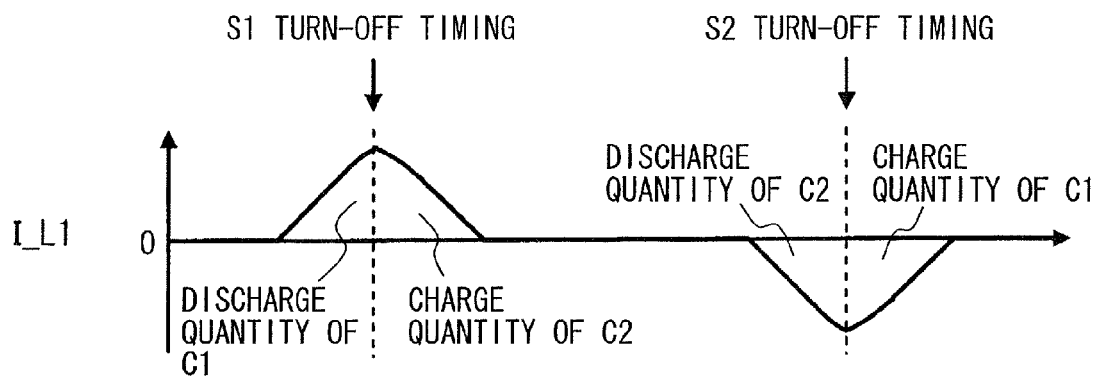
FIG. 10 is a view showing a relation between a current supplied to an inductor, a charge quantity, and a discharge quantity of capacitors C1 and C2.
Figure 11:
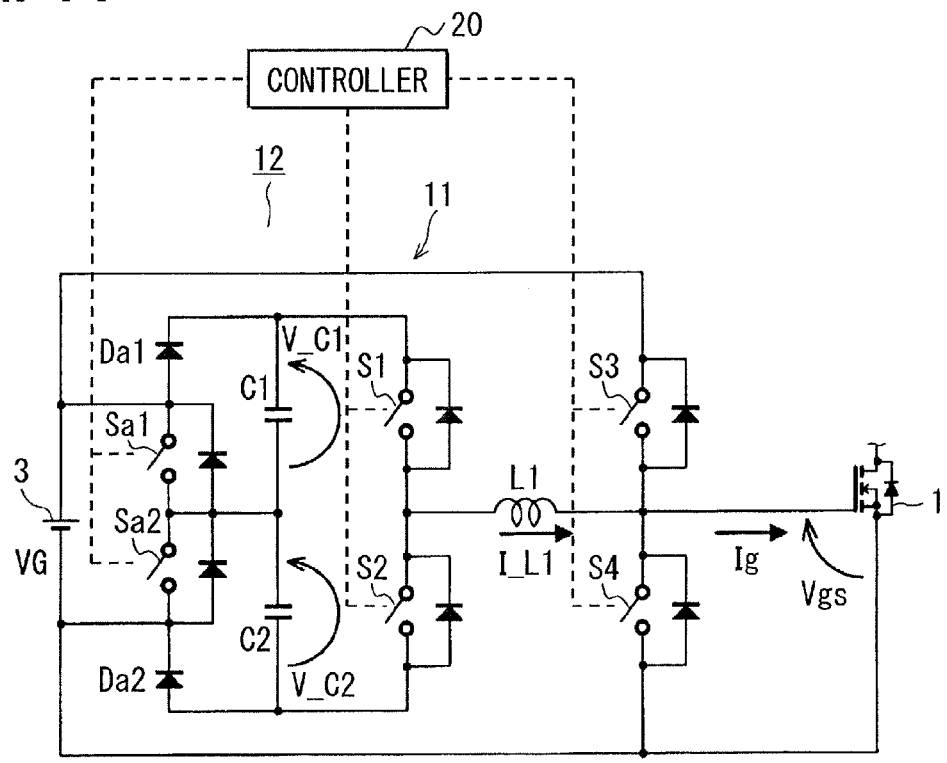
FIG. 11 is a diagram showing an electric configuration of a drive circuit according to a fourth embodiment.

FIGS. 9 and 10 show the third embodiment. As shown in FIG. 9, the third embodiment turns off the switch S1 at timing between the timing (6) for turning off the switch S4 and the timing (8) for turning on the switch S3. The period is longer than that of the first embodiment and is shorter than that of the second embodiment. That is, the switch S1 turns off at the timing (8) according to the first embodiment and at the timing (6) according to the second embodiment. As shown in FIG. 10, the terminal voltages V_C1 and V_C2 can remain constant by adjusting the charge/discharge quantity of the capacitors C1 and C2 so as to make the discharge quantity approximately equal to the charge quantity. At a given control cycle, for example, the charge quantity of the capacitors C1 and C2 may be increased so that the terminal voltages V_C1 and V_C2 become higher than the power supply voltage VG. This enables to fast turn on or off the N-channel FET 1.

Unlike the third embodiment, for example, a possible technique may change two patterns each other. One pattern forms the first to eighth energizing paths (1) to (8) according to the first embodiment when the N-channel FET 1 turns on or off. The other pattern replaces the energizing paths (6) and (8) out of them for the on/off states with the energizing paths (6) and (8) according to the second embodiment. That is, the technique switches between the pattern for forming the energizing paths according to the first embodiment and the pattern for forming the energizing paths according to the second embodiment. The pattern switching signifies alternately implementing the former and the latter once or more. Both may or may not be implemented for the same number of times successively.

Accordingly, it may be conceivable to appropriately combine the pattern of a longer discharge period according to the first embodiment with the pattern of a longer charge period according to the second embodiment. This enables adjustment of increasing in the terminal voltages V_C1 and V_C2 higher than the power supply voltage VG as needed, fast turning on or off the N-channel FET 1, or maintaining the terminal voltages V_C1 and V_C2 constant. As needed, the control circuit 10 may be provided with a voltage measurement unit that analog-to-digital converts the terminal voltages V_C1 and V_C2 for monitoring.

(Fourth Embodiment)

FIGS. 11 to 14 show a forth embodiment. The following describes differences from the first embodiment. A drive circuit 11 shown in FIG. 11 uses substantially the same circuit components as for the drive circuit 2. It is noted that, some components are differently connected. A series circuit of the switches S3 and S4 is directly connected to both ends of the gate drive power supply 3. The switches Sa1 and Sa2 are connected in series. A series circuit of the capacitors C1 and C2 and a series circuit of the switches S1 and S2 are connected in parallel between the cathode of the diode Da1 and the anode of the diode Da2. The switches S1 to S4 and a control circuit 20 configure an energization control circuit 12.

Figure 12:
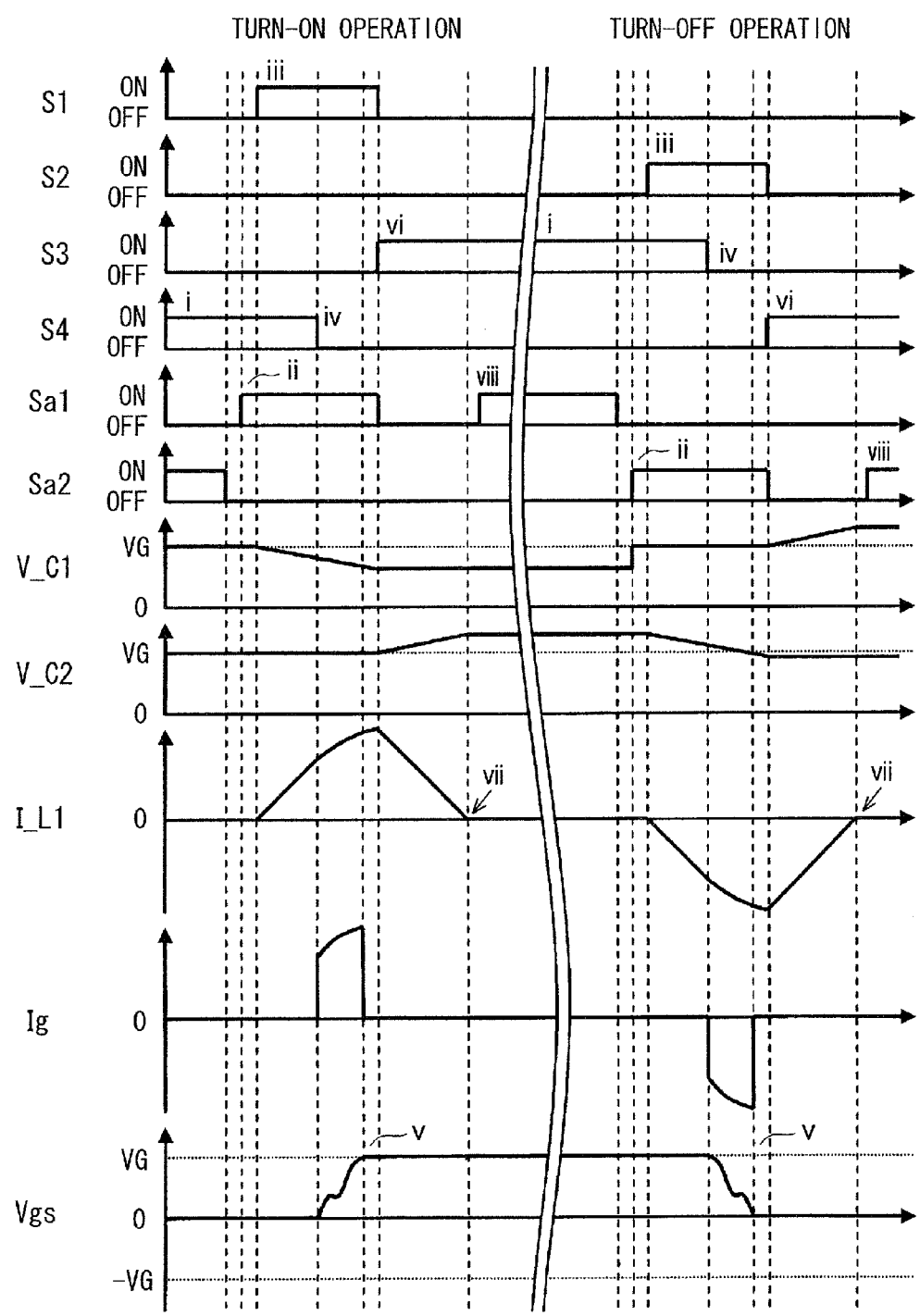
FIG. 12 is a timing chart according to the fourth embodiment.
Figure 13:
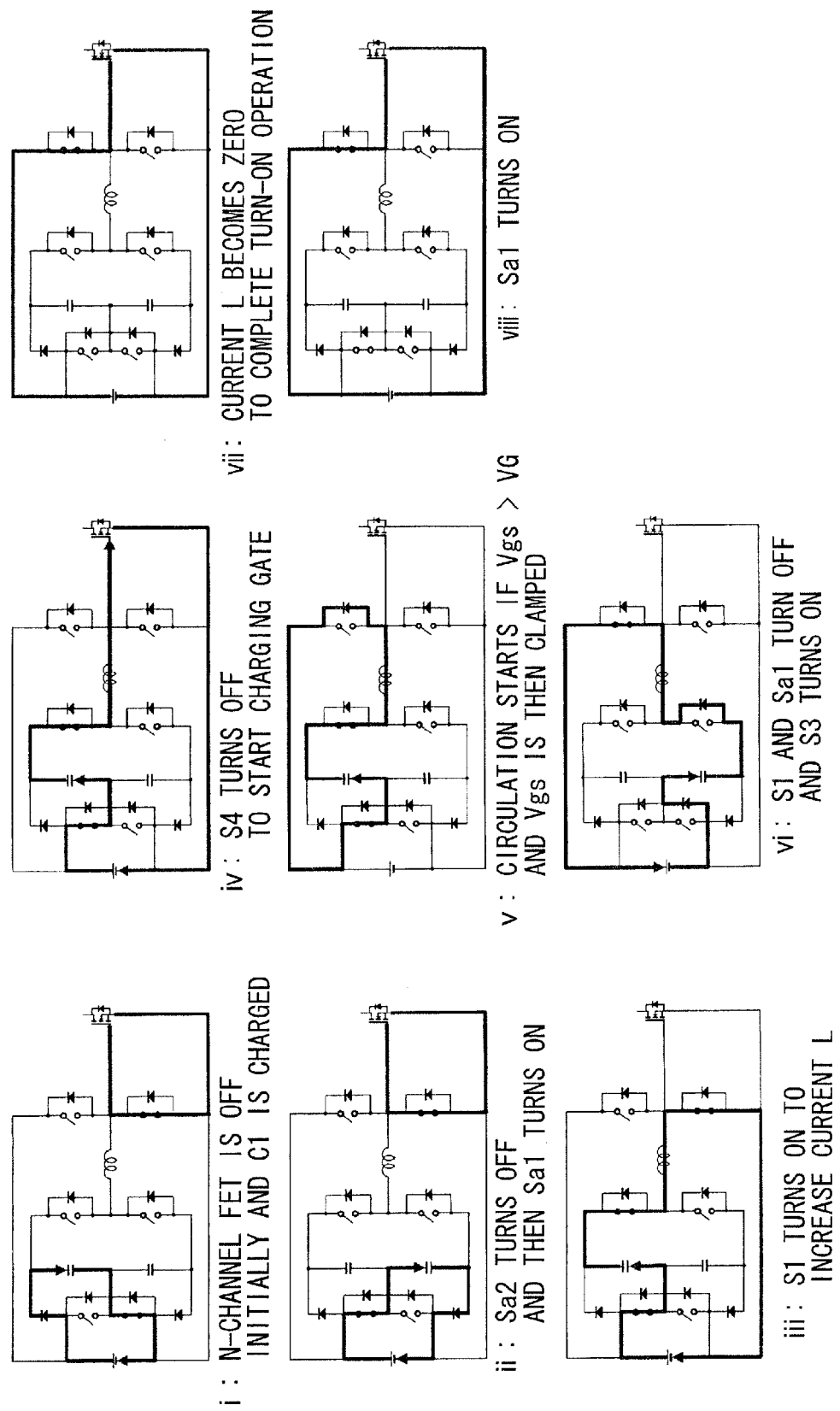
FIG. 13 is a view showing a state transition of an energizing path.
Figure 14:
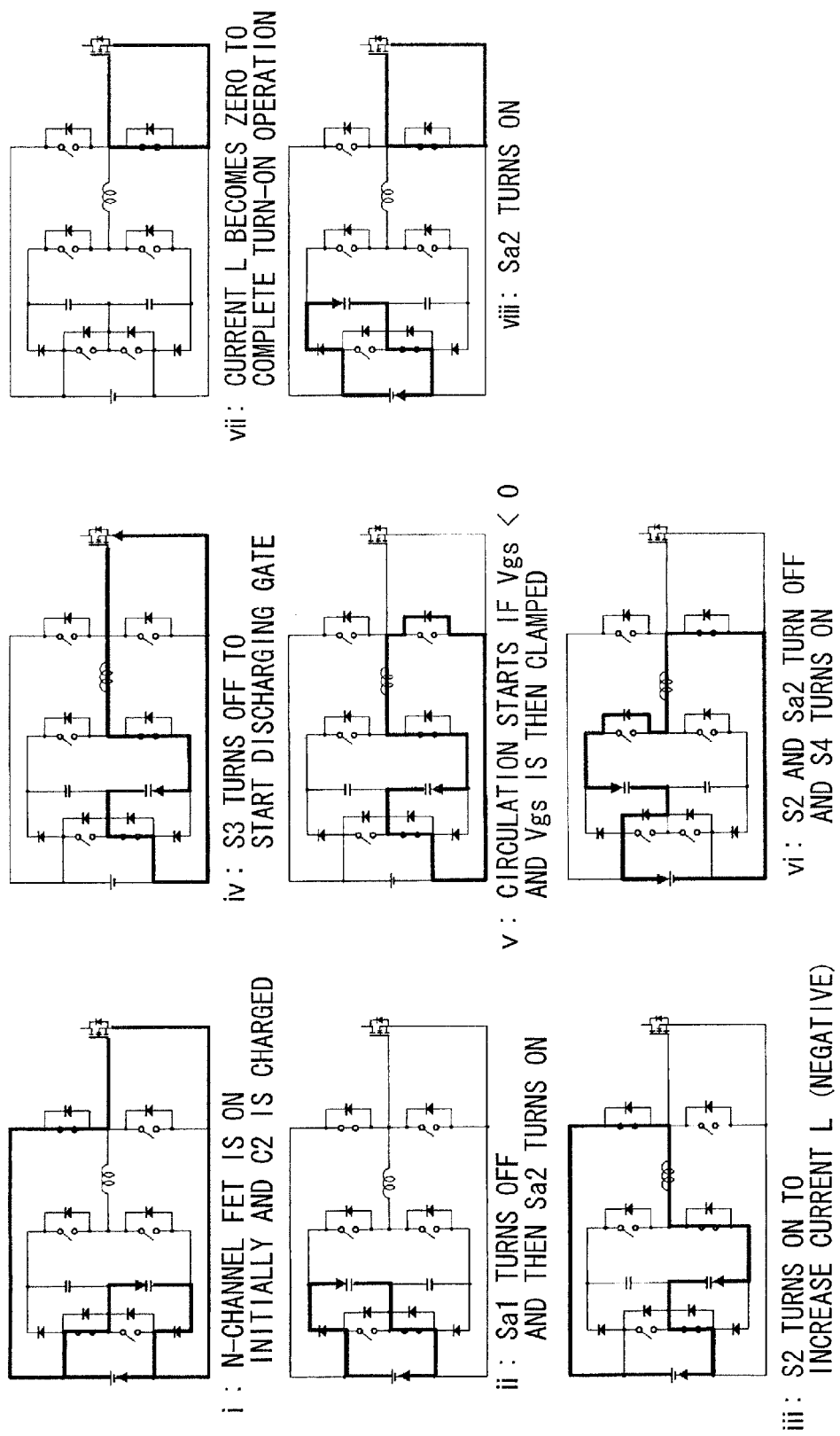
FIG. 14 is a view showing a state transition of the energizing path.

The following describes operations of the fourth embodiment with reference to FIGS. 12 to 14.

Turning on the N-channel FET 1

(1) As an initial state in FIG. 13, the switches Sa2 and S4 turn on. The gate of the N-channel FET 1 is connected to the ground potential. The N-channel FET 1 is turned off. In this state, the capacitor C1 is charged to the voltage (VG−Vf). (2) The switch Sa2 turns off and the switch Sa1 turns on to charge the capacitor C2 to the voltage (VG−Vf).

(3) Turning on the switch S1 forms an energizing path from the positive-bias-side terminal of the gate drive power supply 3 to the switch Sa1, the capacitor C1, the switches S1, S4, and Sa2, and the negative-bias-side terminal of the gate drive power supply 3. The capacitor C1 is connected to the gate drive power supply 3 in series. As a result, the voltage (2VG−Vf) is applied to the inductor L1, and thereby, the current I_L1 increases. (4) Turning off the switch S4 in this state supplies the current I_L1 as the current Ig to the gate of the N-channel FET 1 and charges the gate. The current I_L1 is stored in the inductor L1 to accumulate an electromagnetic energy.

The gate-source voltage Vgs in the N-channel FET 1 increases and becomes higher than the voltage VG. (5) The current I_L1 then flows through the free wheel diode of the switch S3, the switch Sa1, the capacitor C1, and the switch S1. As a result, the voltage Vgs is clamped at the voltage VG. (6) In this state, the switches Sa1 and S1 turn off and the switch S3 turns on. The current L_L1 flows through a path from the switch S3, the gate drive power supply 3, the free wheel diode of the switch Sa2, the capacitor C2, the free wheel diode of the switch S2, and the inductor L1. The current I_L1 is regenerated toward the gate drive power supply 3. (7) Finally, zeroing the current I_L1 turns on the N-channel FET 1. (8) Turning on the switch Sa1 charges the capacitor C2.

Turning off the N-channel FET 1

(1) As described above, the N-channel FET 1 turns on to charge the capacitor C2. (2) The switch Sa1 turns off and then the switch Sa2 turns on to charge the capacitor C1. (3) The switch S2 turns on to form an energizing path from the positive-bias-side terminal of the gate drive power supply 3 to the switches S3 and S2, the capacitor C2, the switch Sa2, and the negative-bias-side terminal of the gate drive power supply 3. The capacitor C2 is connected to the gate drive power supply 3 in series. As a result, the voltage (2VG−Vf) is applied to the inductor L1. The current I_L1 increases in the direction opposite to that for the N-channel FET 1 turned on. (4) In this state, turning off the switch S3 allows the current I_L1 to flow as the current Ig from the gate of the N-channel FET 1, discharging the gate.

The gate-source voltage Vgs for the N-channel FET 1 decreases and becomes lower than 0 V. (5) The current I_L1 then flows through the switch S2, the capacitor C2, the switch Sa2, and the free wheel diode of the switch S4. The voltage Vgs is then clamped at 0 V. (6) In this state, the switches Sa2 and S2 turn off and the switch S4 turns on. The current I_L1 flows through a path from the free wheel diode of the switch S1 to the capacitor C1, the free wheel diode of the switch Sa1, the gate drive power supply 3, the switch S4, and the inductor L1. The current I_L1 is regenerated toward the gate drive power supply 3. (7) Finally, zeroing the current I_L1 turns off the N-channel FET 1. (8) Turning on the switch Sa2 charges the capacitor C1.

According to the fourth embodiment, the capacitors C1 and C2 are connected in series. Two series circuits configure the energization control circuit 12. That is, one includes the capacitors C1 and C2 connected in parallel to the switches Sa1 and Sa2. The other includes the gate drive power supply 3 connected in parallel to the switches S3 and S4. The inductor L1 is connected between the common connection point of the switches S1 and S2 and the common connection point of the switches S3 and S4. This configuration can control on/off states of the switches Sa1, Sa2, and S1 to S4 and thereby provide the energizing paths corresponding to (1) to (8) according to the aspect 1 as described above.

(Fifth Embodiment)

Figure 15:
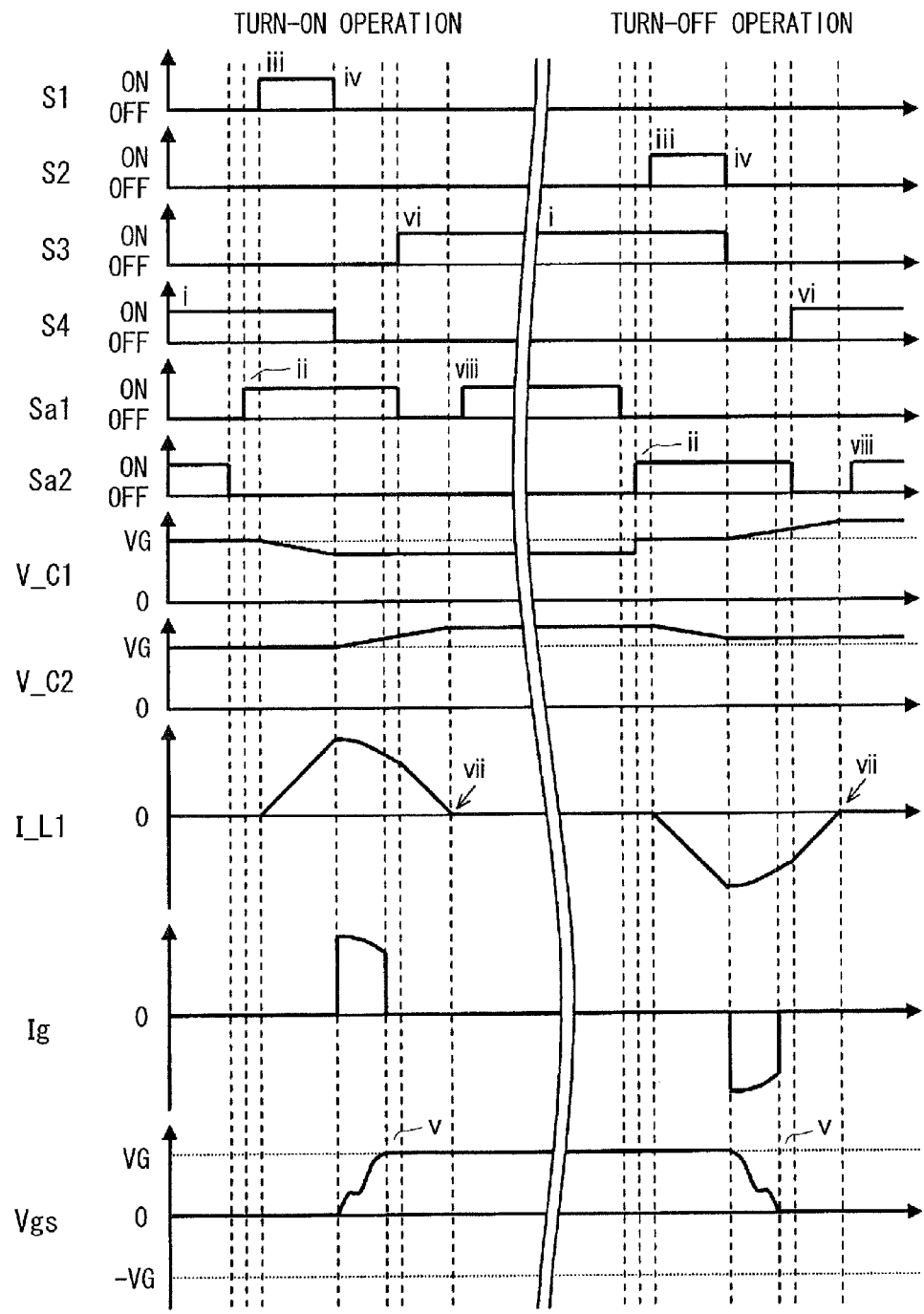
FIG. 15 is a timing chart according to a fifth embodiment.
Figure 16:
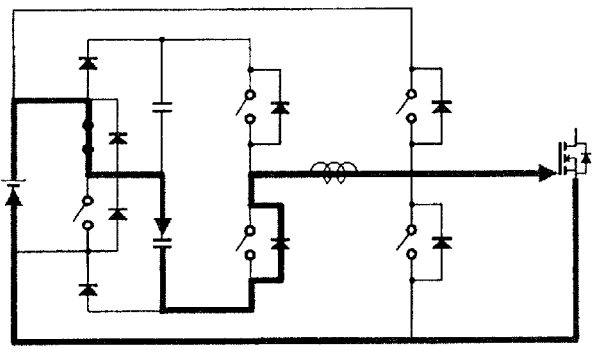
FIG. 16 is a view showing a state transition of an energizing path.
Figure 16:
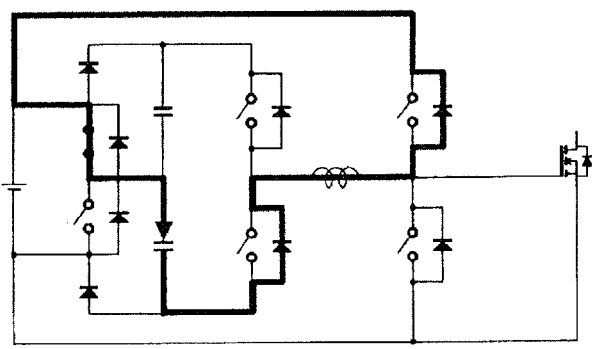
Figure 16:
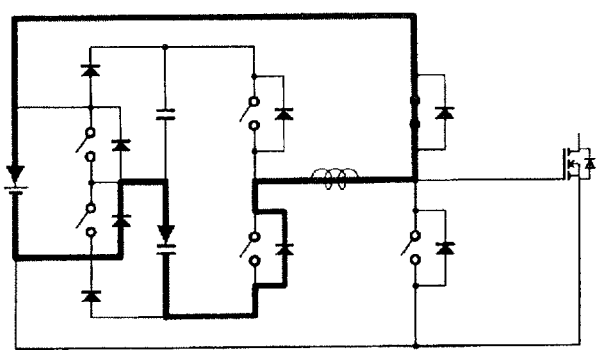
Figure 17:
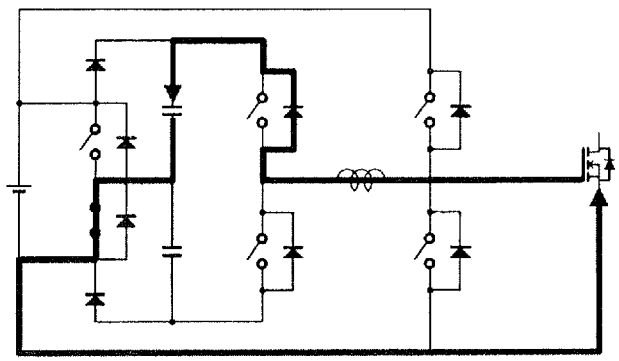
FIG. 17 is a view showing a state transition of the energizing path.
Figure 17:
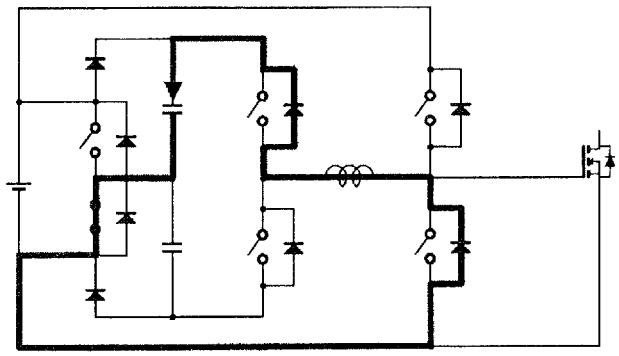
Figure 17:
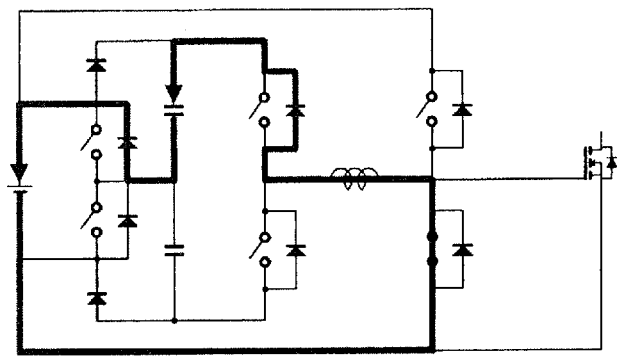
Figure 18:
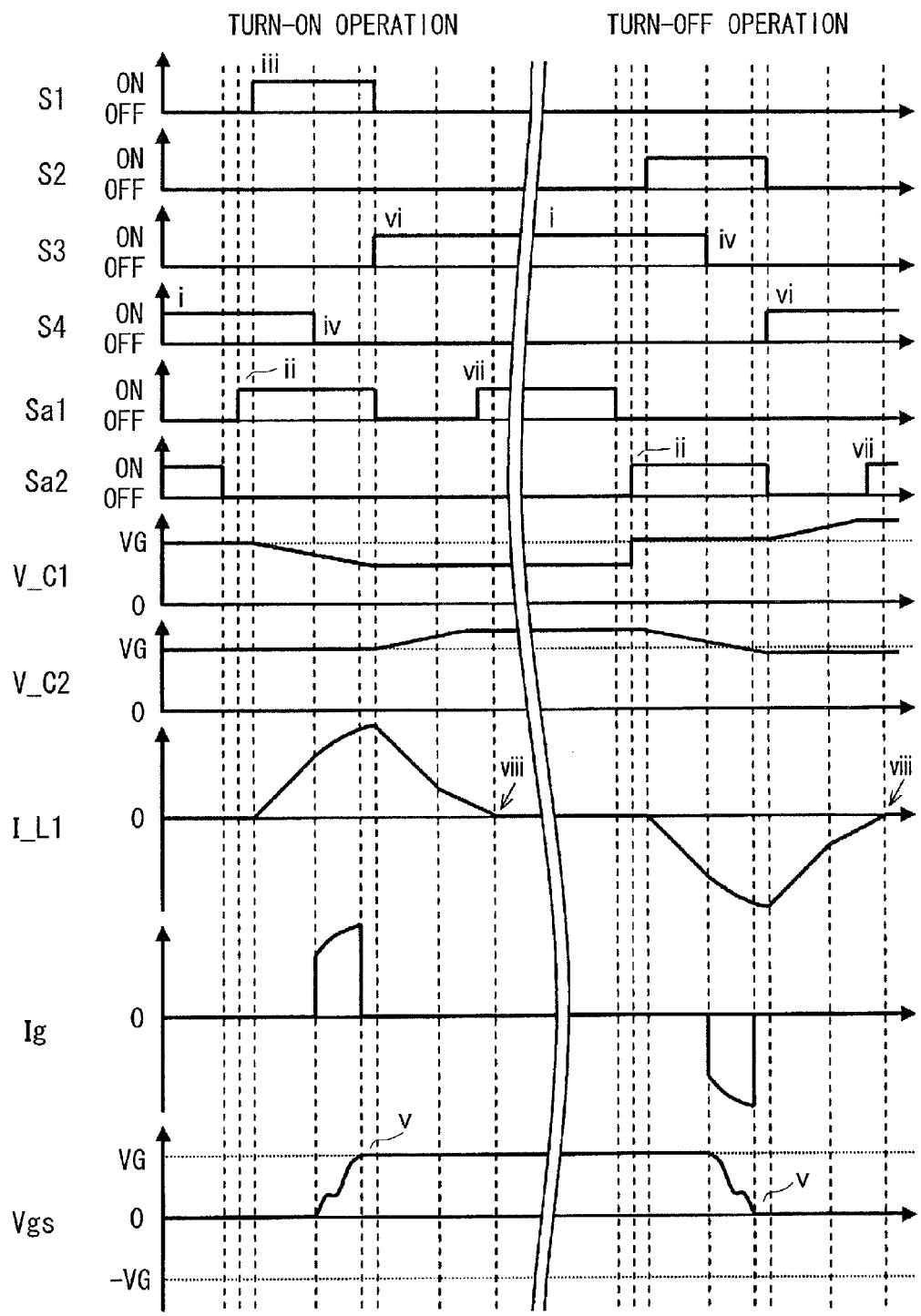
FIG. 18 is a timing chart according to a sixth embodiment.

FIGS. 15 to 17 show a fifth embodiment. The following describes differences from the fourth embodiment. The configuration of the fifth embodiment is substantially the same as that of the fourth embodiment, and some of the switches turn on or off at different timings. FIG. 15 is equivalent to FIG. 12. FIGS. 16 and 17 are partially equivalent to FIGS. 13 and 14. The control pattern of the fourth embodiment corresponds to the first embodiment. The control pattern of the fifth embodiment corresponds to the second embodiment.

Turning on the N-channel FET 1

Switching patterns (4) and (6) shown in FIG. 16 differ from those of the fourth embodiment. In (4), the switch S4 as well as the switch S1 turns off. The current I_L1 or Ig to charge the gate of the N-channel FET 1 flows through a path of the inductor L1, the gate-source of the N-channel FET 1, the gate drive power supply 3, the switch Sa1, the capacitor C2, and the free wheel diode of the switch S3. The capacitor C2 is then charged.

The gate-source voltage Vgs increases over the voltage VG. (5) The current I_L1 then flows through the free wheel diode of the switch S3, the switch Sa1, the capacitor C2, and the free wheel diode of the switch S2. The capacitor C2 is charged also at this time. As a result, as shown in FIG. 15, the potential V_C2 of the capacitor C2 increases over the power supply voltage VG. (6) In this state, the switch S3 turns on and the switch Sa1 turns off to cause the same state as (6) shown in FIG. 13.

Turning off the N-channel FET 1

Also in this case, switching patterns (4) and (6) in FIG. 17 differ from those of the fourth embodiment. The switching pattern (4) turns off the switches S3 and S2. In this case, the current I_L1 or Ig to discharge the gate of the N-channel FET 1 flows through a path of the inductor L1, the free wheel diode of the switch S1, the capacitor C1, the switch Sa2, and the source-gage of the N-channel FET 1. The capacitor C1 is then charged.

The gate-source voltage Vgs becomes lower than 0 V. (5) The current I_L1 then flows through the free wheel diode of the switch S1, the capacitor C1, the switch Sa2, and the free wheel diode of the switch S4. The capacitor C1 is charged also at this time. As a result, as shown in FIG. 15, the potential V_C1 of the capacitor C1 increases over the power supply voltage VG. (6) In this state, the switch S4 turns on and the switch Sa2 turns off to cause the same state as (6) shown in FIG. 14. The drive circuit 11 also may need to combine the control pattern of the fourth embodiment with the control pattern of the fifth embodiment similarly to the third embodiment in order to keep constant the terminal voltages V_C1 and V_C2 of the capacitors C1 and C2. This will be described in a following sixth embodiment.

(Sixth Embodiment)

Figure 19:
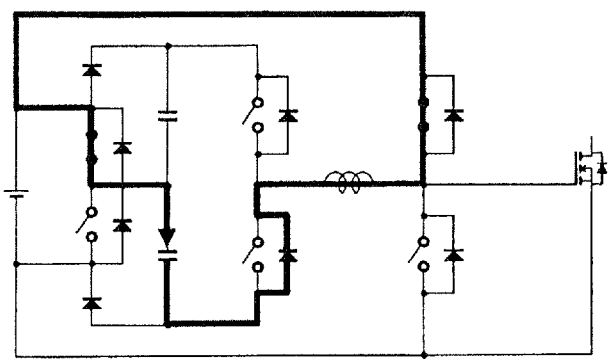
FIG. 19 is a view showing a state transition of an energizing path.
Figure 19:
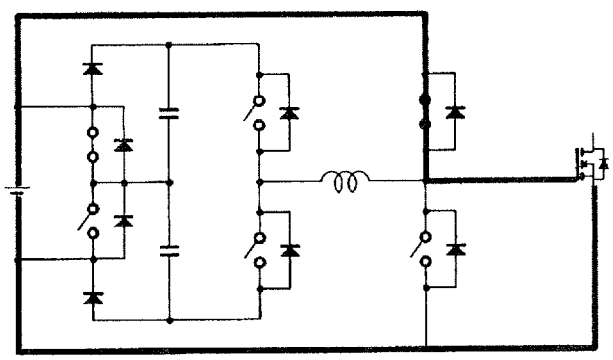

FIGS. 18 and 21A to 21C show the sixth embodiment. According to the fourth embodiment shown in FIG. 12, the N-channel FET 1 turns on while the state of the pattern (6) is maintained, the pattern (7) zeros the current I_L1, and the pattern (8) then turns on the switch Sa1. In the sixth embodiment, however, the pattern (7) turns on the switch Sa1 before the pattern (8) zeros the current I_L1 from the state in (6). In the pattern (7) as shown in FIG. 19, a circulating current flows through a path of the inductor L1, the switches S3 and Sa1, the capacitor C2, the free wheel diode of the switch S2, and the inductor L1. The capacitor C2 is charged in this pattern (7) in addition to the pattern (6) according to the fourth embodiment. Therefore, the sixth embodiment can increase the terminal voltage V_C2 of the capacitor C2 more than the fourth embodiment.

Figure 20:
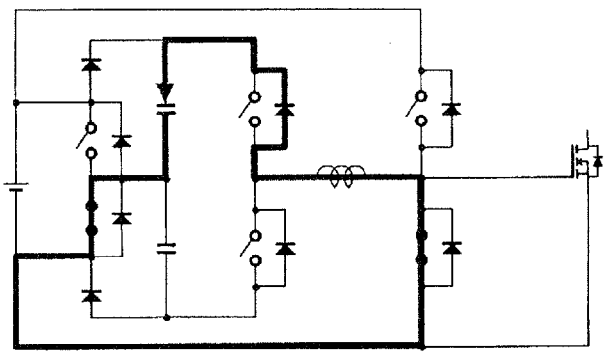
FIG. 20 is a view showing a state transition of the energizing path.
Figure 20:
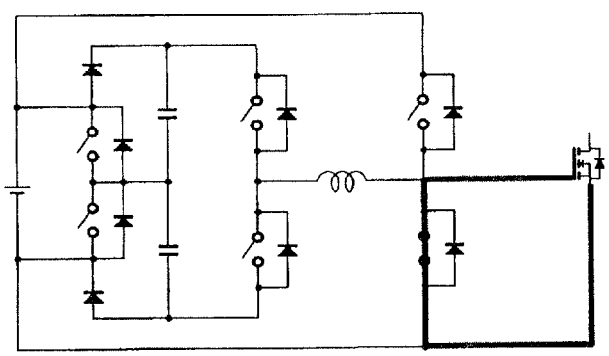

When the N-channel FET 1 turns off, the pattern (7) turns on the switch Sa2 before the pattern (8) zeros the reverse polarity current I_L1 from the state (6). As shown in FIG. 20, a circulating current flows through a path of the inductor L1, the free wheel diode of the switch S1, the capacitor C1, the switches Sa2 and S4, and the inductor L1. The capacitor C1 is charged at (7) in addition to (6) according to the fourth embodiment. The fourth embodiment allows the charge quantity to be smaller than the discharge quantity for the capacitors C1 and C2. The sixth embodiment can allow both quantities to be approximately equal to each other by increasing the charge quantity.

Figure 21A:
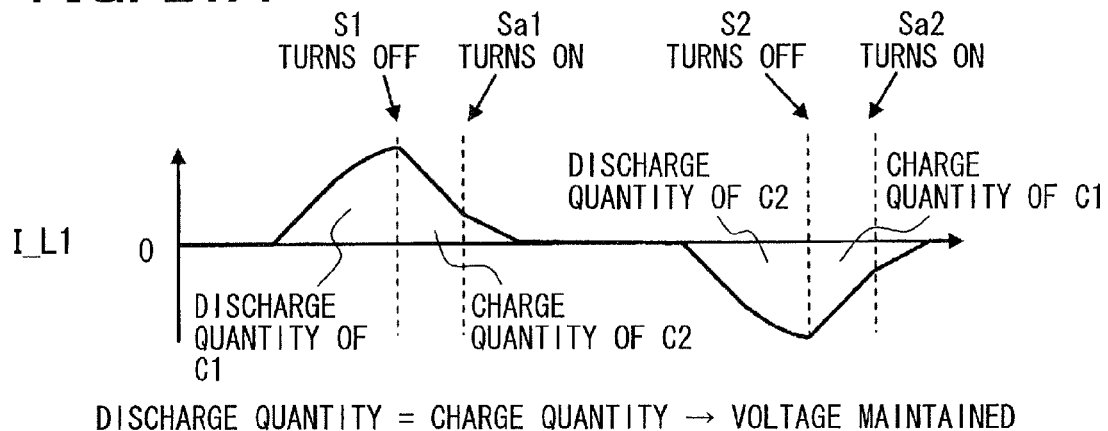
FIGS. 21A, 21B, and 21C are views each showing a relation between a current supplied to an inductor, a charge quantity, and a discharge quantity of capacitors C1 and C2.
Figure 21B:
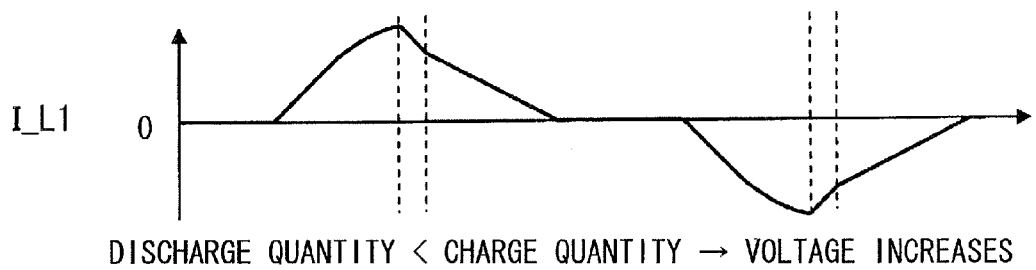
Figure 21C:
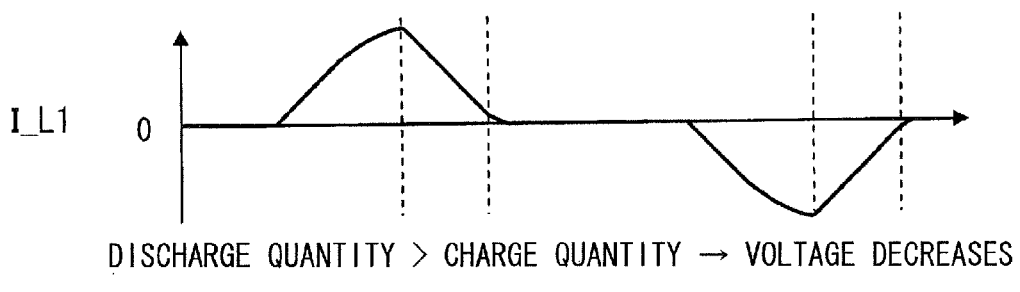
Figure 22:
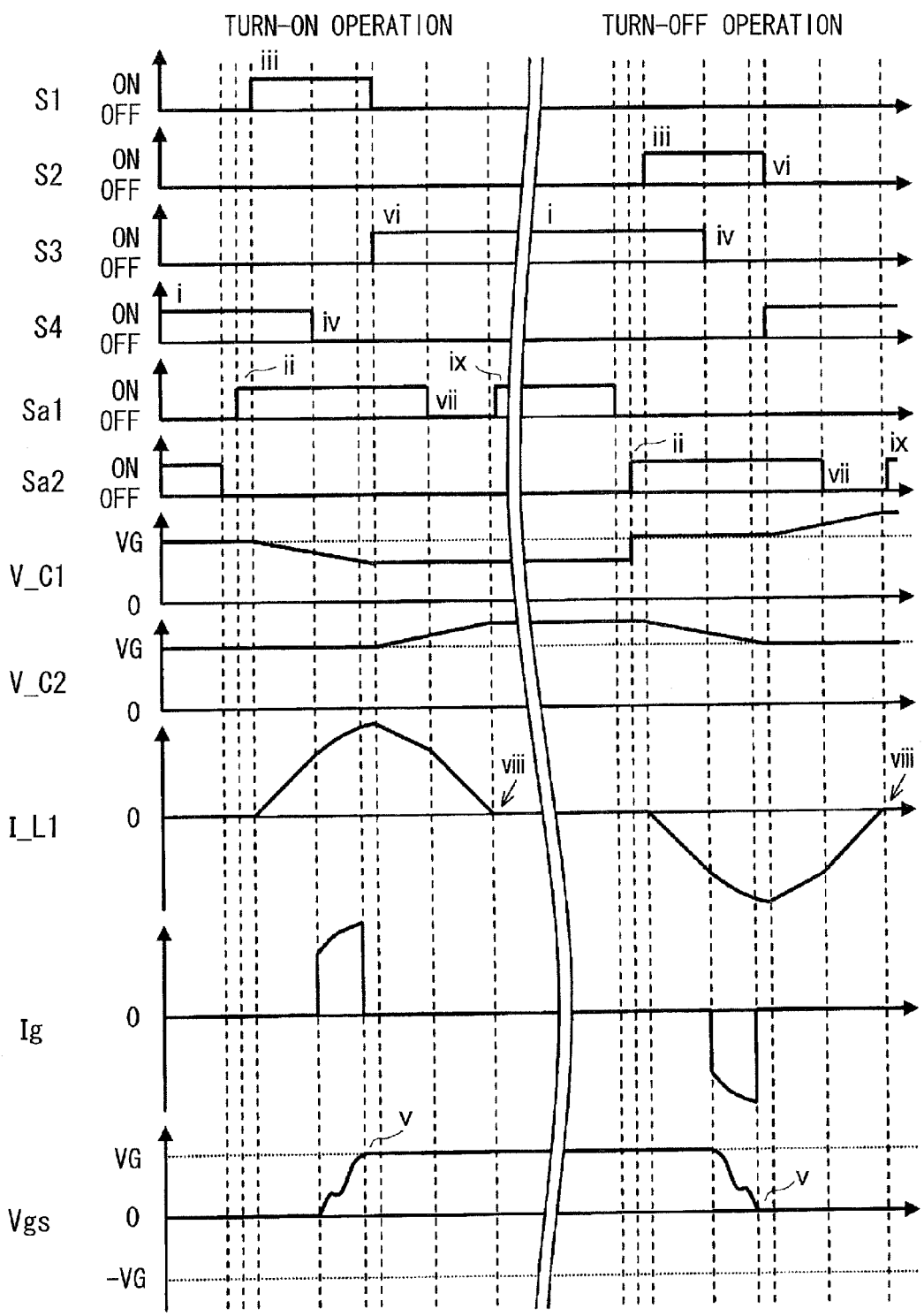
FIG. 22 is a timing chart according to a seventh embodiment.

When the N-channel FET 1 turns on as shown in FIGS. 21A to 21C, the period length from turning on the switch S1 to turning off the switch S1 specifies the discharge quantity of the capacitor C1. The period length from turning off the switch S1 to turning on the switch Sa1 specifies the charge quantity of the capacitor C2. When the N-channel FET 1 turns off, the period length from turning on the switch S2 to turning off the switch S2 specifies the discharge quantity of the capacitor C2. The period length from turning off the switch S2 to turning on the switch Sa2 specifies the charge quantity of the capacitor C1.

For example, the switches Sa1 and Sa2 may turn on at adjusted timings while the switches S1 and S2 may turn on during a predetermined period. At a given control cycle, charge quantities of the capacitors C1 and C2 can be increased to make the terminal voltages V_C1 and V_C2 higher than the power supply voltage VG. As a result, the N-channel FET 1 can fast turn on or off. In this state, the discharge quantity can be increased so that the terminal voltages V_C1 and V_C2 maintain the power supply voltage VG.

Unlike the sixth embodiment, for example, a possible technique may change two patterns each other. One pattern forms the first to eighth energizing paths (1) to (8) according to the fourth embodiment when the N-channel FET 1 turns on or off. The other pattern replaces the energizing paths (4) and (6) out of them for the on/off states with the energizing paths (4) and (6) according to the fifth embodiment. That is, the technique switches between the pattern for forming the energizing paths according to the fourth embodiment and the pattern for forming the energizing paths according to the fifth embodiment. The pattern switching signifies alternately implementing the former and the latter once or more. Both may or may not be implemented for the same number of times successively.

Accordingly, it may be conceivable to appropriately combine the pattern of a longer discharge period according to the fourth embodiment with the pattern of a longer charge period according to the fifth embodiment. This enables adjustment of increasing the terminal voltages V_C1 and V_C2 higher than the power supply voltage VG as needed, fast turning on or off the N-channel FET 1, or maintaining the terminal voltages V_C1 and V_C2 constant.

(Seventh Embodiment)

Figure 23:
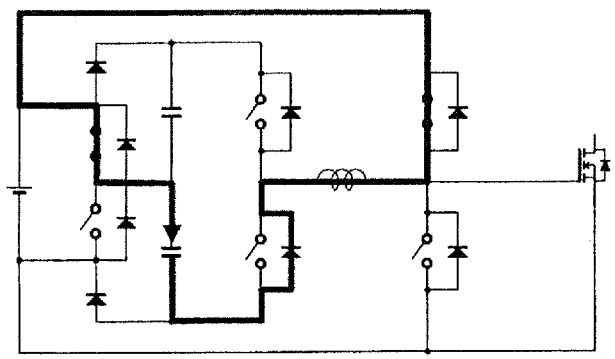
FIG. 23 is a view showing a state transition of an energizing path.
Figure 23:
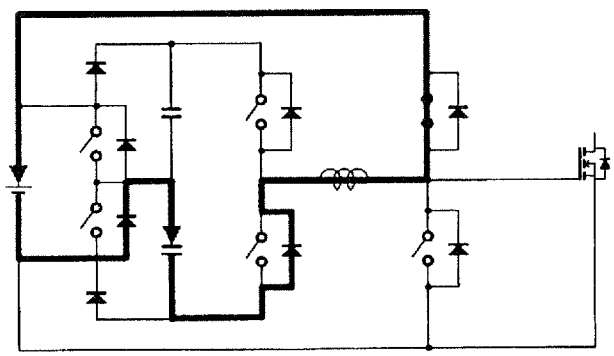

FIGS. 22 to 25A, 25B, and 25C show a seventh embodiment. The following describes differences from the fourth embodiment. When the N-channel FET 1 turns on, the pattern (6) according to the fourth embodiment turns off the switch S1, turns on the switch S3, and turns off the switch Sa1. The seventh embodiment extends the period to keep the switch Sa1 turned on. As a result, as shown in FIG. 23, the path of (6) follows the inductor L1, the switches S3 and Sa1, the capacitor C2, the free wheel diode of the switch S2, and the inductor L1. The path charges the capacitor C2 at the same time. In (7), turning off the switch Sa1 forms the same route as (6) according to the fourth embodiment.

Figure 24:
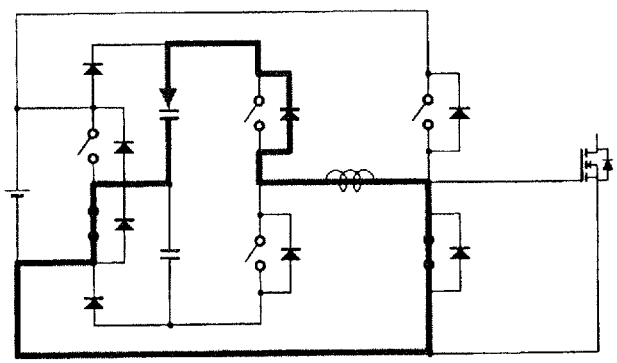
FIG. 24 is a view showing a state transition of the energizing path.
Figure 24:
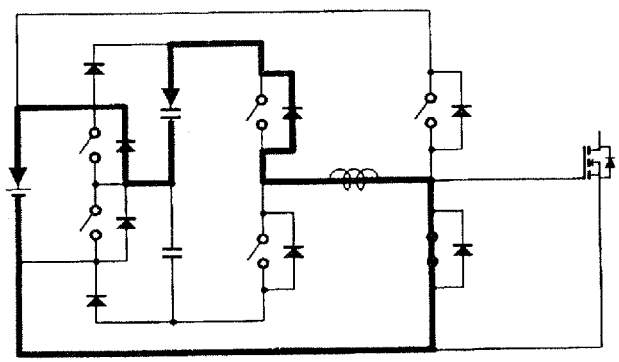

When the N-channel FET 1 turns off, the pattern (6) according to the fourth embodiment turns off the switch S2, turns on the switch S4, and turns off the switch Sa2. The seventh embodiment extends the period to keep the switch Sa2 turned on. As a result, as shown in FIG. 24, the path of (6) follows the inductor L1, the free wheel diode of the switch S1, the capacitor C1, the switches Sa2 and S4, and the inductor L1. The path charges the capacitor C1 at the same time. In (7), turning off the switch Sa2 forms the same route as (6) according to the fourth embodiment.

Figure 25A:
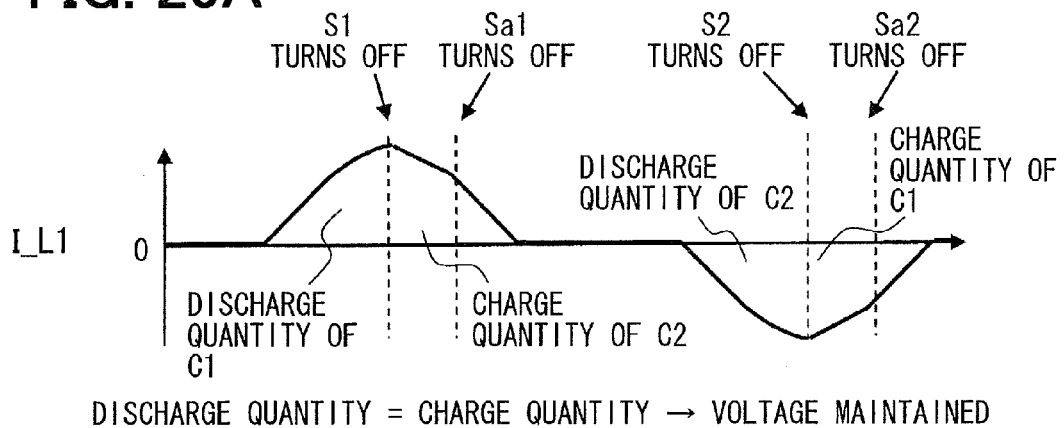
FIGS. 25A, 25B, and 25C are views each showing a relation between a current supplied to an inductor, a charge quantity, and a discharge quantity of capacitors C1 and C2.
Figure 25B:
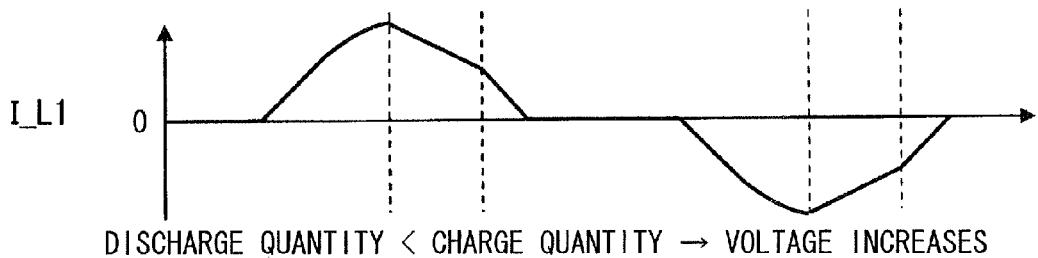
Figure 25C:
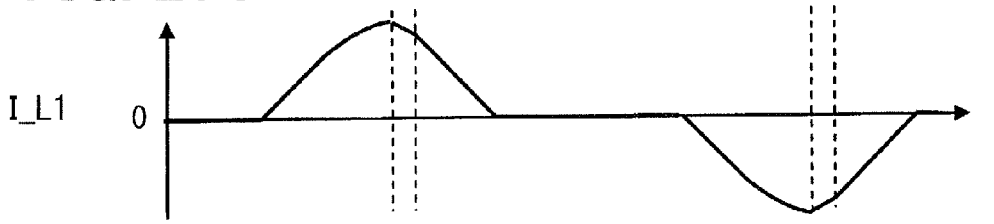

When the N-channel FET 1 turns on according to the seventh embodiment as shown in FIGS. 25A to 25C, the period length from turning on the switch S1 to turning off the switch S1 specifies the discharge quantity of the capacitor C1. The period length from turning off the switch S1 to turning off the switch Sa1 specifies the charge quantity of the capacitor C2. When the N-channel FET 1 turns off, the period length from turning on the switch S2 to turning it off specifies the discharge quantity of the capacitor C2. The period length from turning off the switch S2 to turning off the switch Sa2 specifies the charge quantity of the capacitor C1.

For example, similarly to the sixth embodiment, the switches Sa1 and Sa2 may turn off at adjusted timings while the switches S1 and S2 may turn on during a predetermined period. At a given control cycle, charge quantities of the capacitors C1 and C2 can be increased to make the terminal voltages V_C1 and V_C2 higher than the power supply voltage VG. As a result, the N-channel FET 1 can fast turn on or off. In this state, the discharge quantity can be increased so that the terminal voltages V_C1 and V_C2 maintain the power supply voltage VG.

The present disclosure is not limited to the above-described embodiments and the accompanying drawings but may be modified or enhanced as follows. The negative-bias-side terminal of the gate drive power supply 3 is not limited to the potential of 0 V and may be set to another potential lower than the positive-bias-side terminal. The switches Sa1, Sa2, and S1 to S4 may use MOSFETs, bipolar transistors, or any other semiconductor switching devices.

The above-described configuration is applicable to various voltage-driven switching devices. The switching devices may include MOSFET, MISFET, JFET, and HEMT (High Electron Mobility Transistor). The drive circuit 2 does not need the free wheel diode for the switches Sa1 and Sa2.

Summarizing the above embodiments, an energization control circuit according to aspect 1 is configured to control four energization switching devices and positive-bias-side and negative-bias-side switching devices. A current is bidirectionally applied to an inductor. A current flowing through the inductor charges a control terminal of a drive-target switching device. The control terminal is then discharged. Accordingly, the energization control circuit is configured to be capable of forming first to eighth first to eighth energizing paths (1) to (8). The paths are formed as follows to turn on the drive-target switching device.

(1) In the first path, a positive-bias-side capacitor is charged. (2) In the second path, a drive power supply and the positive-bias-side capacitor are connected in series. The inductor is energized in a direction to charge the control terminal of the drive-target switching device. (3) In the third path, an electromagnetic energy stored in the inductor charges the control terminal of the drive-target switching device. Thus, the drive-target switching device thereby turns on. (4) In the fourth path, a circulating current is applied to the drive power supply when the potential of the charged control terminal becomes higher than a drive power supply voltage.

The paths are formed as follows to turn off the drive-target switching device. (5) In the fifth path, a negative-bias-side capacitor is charged. (6) In the sixth path, the drive power supply and the negative-bias-side capacitor are connected in series. The inductor is energized in a direction to discharge the control terminal of the drive-target switching device. (7) In the seventh path, an electromagnetic energy stored in the inductor discharges the control terminal of the drive-target switching device. The drive-target switching device thereby turns off. (8) In the eighth path, a circulating current is applied to the drive power supply when the potential of the discharged control terminal becomes lower than potential of the drive power supply at its negative-bias-side terminal.

Accordingly, the drive-target switching device can fast turn on for the following reason. The control terminal is restricted from being supplied with an overvoltage. The drive power supply and the charged positive-bias-side capacitor are connected in series to generate an increased voltage. A current flows in accordance with this increased voltage and fast charges the control terminal of the drive-target switching device. The drive-target switching device can fast turn off for the following reason. The drive power supply and the charged negative-bias-side capacitor are connected in series. Similarly, the control terminal is fast discharged.

The semiconductor switching device drive circuit according to aspect 2 configures the energization control circuit that includes: a series circuit of first and second switching devices connected between a cathode of the positive-bias-side diode and an anode of the negative-bias-side diode; and a series circuit of third and fourth switching devices that are connected between the positive-bias-side capacitor and the negative-bias-side capacitor and have a common connection point connected to a control terminal of the drive-target switching device. The inductor is connected between a common connection point of the first and second switching devices and a common connection point of the third and fourth switching devices. This configuration can form the first to eighth energizing paths (1) to (8) by controlling on/off states of the positive-bias-side and negative-bias-side switching devices and the first to fourth switching devices connected according to an H-bridge design with reference to the inductor.

In the semiconductor switching device drive circuit according to aspect 3, the energization control circuit forms the first to eighth energizing paths (1) to (8) by operating the positive-bias-side and negative-bias-side switching devices, and the first to fourth switching devices as follows. It is noted that, in the following, the other switching device(s) is assumed to be off unless the switching device(s) described as being on, and the switching device(s) are assumed to maintain one of on-state and off-state unless the switching device(s) is described as being one of turned off and turned on.

(0) The drive-target switching device turns off as an initial state in which the positive-bias-side and negative-bias-side switching devices and the fourth switching device remain on. (1) The positive-bias-side switching device turns off and the third switching device turns on in order. The positive-bias-side capacitor is charged to (VG−Vf) through a path of the drive power supply (+), the positive-bias-side diode, the positive-bias-side capacitor, the third and fourth switching devices, the negative-bias-side switching device, and the drive power supply (−). VG denotes a voltage of the drive power supply and Vf denotes a forward voltage of the diode.

(2) The third switching device turns off, the positive-bias-side switching device turns on, and first switching device turns on in order. This forms a path of the drive power supply (+), the positive-bias-side switching device, the positive-bias-side capacitor, the first switching device, the inductor, the fourth switching device, the negative-bias-side switching device, and the drive power supply (−). A voltage of (2VG−Vf) is applied to the inductor.

(3) In this state, the fourth switching device turns off. A path is then formed from the drive power supply (+) to the positive-bias-side switching device, the positive-bias-side capacitor, the first switching device, the inductor, a control terminal and a potential reference output terminal of the drive-target switching device, the negative-bias-side switching device, and the drive power supply (−). The potential reference output terminal may be connected to a positive-bias-side terminal of the drive power supply depending on voltage types of the drive-target switching device. As a result, a current flowing through the inductor charges the control terminal of the drive-target switching device and increases the potential at the control terminal. The drive-target switching device transitions to a turn-on state.

When potential Vgs at the control terminal increases and becomes higher than VG, a circulating current flows through a path of the inductor, a free wheel diode of the third switching device, the positive-bias-side capacitor, the first switching device, and the inductor. Accordingly, the potential Vgs at the control terminal is clamped at the power supply voltage VG. In this state, (4) the first switching device turns off and the third switching device turns on. A path is then formed from the inductor to the third switching device, the positive-bias-side switching device, the drive power supply, the negative-bias-side switching device, the negative-bias-side capacitor, a free wheel diode of the second switching device, and the inductor. A circulating current is thereby regenerated to the drive power supply. The drive-target switching device finally turns on when the current flowing through the inductor becomes zero.

To turn off the drive-target switching device, (5) the negative-bias-side switching device turns off and the fourth switching device turns on in order. The capacitor is then charged to (VG−Vf) through a path of drive power supply (+), the positive-bias-side switching device, the third and fourth switching devices, the negative-bias-side capacitor, the negative-bias-side diode, and the drive power supply (−).

(6) The fourth switching device turns off, the negative-bias-side switching device turns on, and the second switching device turns on. A path is then formed from the drive power supply (+) to the positive-bias-side switching device, the third switching device, the inductor, the second switching device, the negative-bias-side capacitor, the negative-bias-side switching device, and the drive power supply (−). The inductor is energized at a voltage of (2VG−Vf) in the direction opposite to (2).

In this state, (7) the third switching device turns off. A path is then formed from the control terminal of the drive-target switching device to the inductor, the second switching device, the negative-bias-side capacitor, and the potential reference output terminal of the drive-target switching device. A current flowing through the inductor discharges the control terminal of the drive-target switching device to decrease the potential of the control terminal. The drive-target switching device transitions to a turn-off state.

The potential Vgs at the control terminal decreases to become smaller than the potential of the drive power supply (−). A circulating current then flows through a path of the inductor, the second switching device, the negative-bias-side capacitor, the free wheel diode of the fourth switching device, and the inductor. Accordingly, the potential Vgs of the control terminal is clamped at the potential of the drive power supply (−). In this state, (8) the second switching device turns off and the fourth switching device turns on. A path is then formed from the inductor to the free wheel diode of the first switching device, the positive-bias-side capacitor, the positive-bias-side switching device, the drive power supply, the negative-bias-side switching device, the fourth switching device, and the inductor. A circulating current is thereby regenerated to the drive power supply. The drive-target switching device finally turns off when the current flowing through the inductor becomes zero.

In the semiconductor switching device drive circuit according to aspect 4, the energization control circuit forms the first to eighth energizing paths (1) to (8) by operating the positive-bias-side and negative-bias-side switching devices, and the first to fourth switching devices as follows. It is noted that, in the following, the other switching device(s) is assumed to be off unless the switching device(s) described as being on, and the switching device(s) are assumed to maintain one of on-state and off-state unless the switching device(s) is described as being one of turned off and turned on. The following describes differences from aspect 3. To turn on the drive-target switching device according to aspect 4, (3) the first and fourth switching devices turn off. A path is then formed from the inductor to the control terminal and the potential reference output terminal of the drive-target switching device, the negative-bias-side capacitor, the free wheel diode of the second switching device, and the inductor. The drive-target switching device transitions to a turn-on state. At this time, a charge current flows through the negative-bias-side capacitor. Its terminal voltage increases over the power supply voltage VG.

When the potential Vgs at the control terminal increases and becomes higher than VG, a path is formed from the inductor to the free wheel diode of the third switching device, the positive-bias-side switching device, the drive power supply, the negative-bias-side switching device, the negative-bias-side capacitor, the free wheel diode of the second switching device, and the inductor. A circulating current is thereby regenerated to the drive power supply. The potential Vgs at the control terminal is clamped at the power supply voltage VG. Also at this time, a charge current flows through the negative-bias-side capacitor. Its terminal voltage continues to increase. The subsequent path (4) turns on only the third switching device. The same energizing path as (4) in aspect 3 is formed. Also at this time, the negative-bias-side capacitor is charged. Thereby, its terminal voltage continues to increase.

To turn off the drive-target switching device, the path (7) turns off the second and third switching devices. A path is then formed from the control terminal of the drive-target switching device to the inductor, the free wheel diode of the first switching device, the positive-bias-side capacitor, the positive-bias-side switching device, the drive power supply, the negative-bias-side switching device, and the potential reference output terminal of the drive-target switching device. The drive-target switching device transitions to a turn-off state. A circulating current is regenerated to the drive power supply. At this time, a charge current flows through the positive-bias-side capacitor. Its terminal voltage increases over the power supply voltage VG.

When the potential Vgs of the control terminal becomes smaller than the potential of the drive power supply (−), a circulating current flows through a path of the inductor, the free wheel diode of the first switching device, the positive-bias-side capacitor, the positive-bias-side switching device, the drive power supply, the negative-bias-side switching device, the free wheel diode of the third switching device, and the inductor. Accordingly, the potential Vgs of the control terminal is clamped at the potential of the drive power supply (−). Also at this time, a charge current flows through the positive-bias-side capacitor. Thereby, its terminal voltage continues to increase. In this state, (8) turning on the fourth switching device forms the same energizing path as (8) in aspect 3. Also at this time, the positive-bias-side capacitor is charged. Its terminal voltage continues to increase.

According to aspect 4, the period to charge the positive-bias-side and negative-bias-side capacitors is longer than aspect 3. Their terminal voltages can be higher than the power supply voltage VG. This enables to fast turn on or off the drive-target switching device.

The semiconductor switching device drive circuit according to aspect 5 switches between a pattern of forming the first to eighth energizing paths (1) to (8) and another pattern containing the same paths except the energizing paths (3), (4), (7), and (8) replaced by energizing paths (3)', (4)', (7)', and (8)'. The energizing paths (3)', (4)', (7)', and (8)' equal to the energizing paths (3), (4), (7), and (8) in aspect 4, respectively.

Aspect 5 switches between the pattern for forming the first to eighth energizing paths (1) to (8) according to aspect 3 and the pattern for forming the first to eighth energizing paths (1) to (8) according to aspect 4. The pattern switching signifies alternately implementing the former and the latter once or more. Both may or may not be implemented for the same number of times successively. It may be conceivable to appropriately combine the pattern of a longer discharge period according to aspect 3 with the pattern of a longer charge period according to aspect 4. Terminal voltages of the positive-bias-side and negative-bias-side capacitors can be higher than the power supply voltage as needed. The terminal voltage can be adjusted so as to be constant.

In the semiconductor switching device drive circuit according to aspect 6, the energization control circuit forms the first to eighth energizing paths (1) to (8) by operating the positive-bias-side and negative-bias-side switching devices, and the first to fourth switching devices as follows. It is noted that, in the following, the other switching device(s) is assumed to be off unless the switching device(s) described as being on, and the switching device(s) are assumed to maintain one of on-state and off-state unless the switching device(s) is described as being one of turned off and turned on. The following describes differences from aspect 3. According to aspect 6, (4) the first switching device turns off and the third switching device turns on in order. (8) The second switching device turns off and the fourth switching device turns on in order.

The period of turning on the first switching device to turn on the drive-target switching device and the period of turning on the second switching device to turn off the drive-target switching device are intermediate between the case of aspect 3 and the case of aspect 4. Accordingly, the period to charge the positive-bias-side and negative-bias-side capacitors is intermediate between both.

In the semiconductor switching device drive circuit according to aspect 7, the energization control circuit adjusts terminal voltages of the positive-bias-side and negative-bias-side capacitors by adjusting a period length from forming the energizing path (3) to turning off the first switching device in the energizing path (4) and a period length from forming the energizing path (7) to turning off the second switching device in the energizing path (8). Terminal voltages of the positive-bias-side and negative-bias-side capacitors can be higher than the power supply voltage as needed. The terminal voltage can be adjusted so as to be constant.

In the semiconductor switching device drive circuit according to aspect 8, the positive-bias-side capacitor and the negative-bias-side capacitor are connected in series. The energization control circuit includes: a series circuit that is connected in parallel to the positive-bias-side and negative-bias-side capacitors and includes first and second switching devices; and a series circuit that is connected in parallel to the drive power supply and includes third and fourth switching devices. The inductor is connected between a common connection point of the first and second switching devices and a common connection point of the third and fourth switching devices. This configuration can form the first to eighth energizing paths (1) to (8) by controlling on/off states of the positive-bias-side and negative-bias-side switching devices and the first to fourth switching devices connected according to an H-bridge design with reference to the inductor. It should be noted that the first and second switching devices are connected to the drive power supply through the positive-bias-side and negative-bias-side diodes, respectively.

In the semiconductor switching device drive circuit according to aspect 9, the energization control circuit forms the energizing path (5) also before forming the energizing path (2) and forms the energizing path (2) also before forming the energizing path (6). The positive-bias-side and negative-bias-side capacitors can be charged previously in order to start a turn-on operation of the drive-target switching device and start a turn-off operation of the drive-target switching device.

In the semiconductor switching device drive circuit according to aspect 10, the energization control circuit forms the first to eighth energizing paths (1) to (8) by operating the positive-bias-side and negative-bias-side switching devices, and the first to fourth switching devices as follows. It is noted that, in the following, the other switching device(s) is assumed to be off unless the switching device(s) described as being on, and the switching device(s) are assumed to maintain one of on-state and off-state unless the switching device(s) is described as being one of turned off and turned on. (0) The drive-target switching device turns off as an initial state in which the fourth switching device remains on. (1) The negative-bias-side switching device remains on. A path is then formed from the drive power supply (+) to the positive-bias-side diode, the positive-bias-side capacitor, the negative-bias-side switching device, and the drive power supply (−). The positive-bias-side capacitor is charged to (VG−Vf).

(5) The negative-bias-side switching device turns off and then positive-bias-side switching device turns on. A path is then formed from the drive power supply (+) to the positive-bias-side switching device, the negative-bias-side capacitor, the negative-bias-side diode, and the drive power supply (−). The negative-bias-side capacitor is charged to (VG−Vf). (2) The first switching device turns on. A path is then formed from the drive power supply (+) to the positive-bias-side switching device, the positive-bias-side capacitor, the first switching device, the inductor, the fourth switching device, and the drive power supply (−). The inductor is energized at a voltage of (2VG−Vf).

In this state, (3) the fourth switching device turns off. A path is then formed from the drive power supply (+) to the positive-bias-side switching device, the positive-bias-side capacitor, the first switching device, the inductor, the control terminal and the potential reference output terminal of the drive-target switching device, and the drive power supply (−). A current flowing through the inductor charges the control terminal of the drive-target switching device to increase the potential at the control terminal. The drive-target switching device transitions to a turn-on state.

When the potential Vgs at the control terminal increases and becomes higher than VG, a circulating current flows through a path of the inductor, the free wheel diode of the third switching device, the positive-bias-side switching device, the positive-bias-side capacitor, the first switching device, and the inductor. Accordingly, the potential Vgs of the control terminal is clamped at the power supply voltage VG.

In this state, (4) the positive-bias-side switching device and the first switching device turn off and the third switching device turns on. A path is then formed from the inductor to the third switching device, the drive power supply, the negative-bias-side diode, the negative-bias-side capacitor, the free wheel diode of the second switching device, and the inductor. A circulating current is thereby regenerated to the drive power supply. The drive-target switching device finally turns on when the current flowing through the inductor becomes zero.

To turn off the drive-target switching device, (5) the positive-bias-side switching device turns on to charge the negative-bias-side capacitor. (2) The positive-bias-side switching device turns off and the negative-bias-side switching device turns on to charge the positive-bias-side capacitor. (6) The second switching device turns on. A path is then formed from the drive power supply (+) to the third switching device, the inductor, the second switching device, the negative-bias-side capacitor, the negative-bias-side switching device, and the drive power supply (−). The inductor is energized at a voltage of (2VG−Vf) in the direction opposite to (2).

In this state, (7) the third switching device turns off. A path is then formed from the control terminal of the drive-target switching device to the inductor, the second switching device, the negative-bias-side capacitor, the negative-bias-side switching device, and the potential reference output terminal of the drive-target switching device. A current flowing through the inductor discharges the control terminal of the drive-target switching device to decrease the potential of the control terminal. The drive-target switching device transitions to a turn-off state.

The potential Vgs at the control terminal decreases to become smaller than the potential of the drive power supply (−). A circulating current then flows through a path of the inductor, the second switching device, the negative-bias-side capacitor, the negative-bias-side switching device, the free wheel diode of the fourth switching device, and the inductor. Accordingly, the potential Vgs of the control terminal is clamped at the potential of the drive power supply (−). In this state, (8) the negative-bias-side switching device and the second switching device turn off and the fourth switching device turns on. A path is then formed from the inductor to the free wheel diode of the first switching device, the positive-bias-side capacitor, the positive-bias-side diode, the drive power supply, the fourth switching device, and the inductor. A circulating current is thereby regenerated to the drive power supply. The drive-target switching device finally turns off when the current flowing through the inductor becomes zero.

In the semiconductor switching device drive circuit according to aspect 11, the energization control circuit forms the first to eighth energizing paths (1) to (8) by operating the positive-bias-side and negative-bias-side switching devices, and the first to fourth switching devices as follows. The following describes differences from aspect 10. According to aspect 11, (3) the first and fourth switching devices turn off. A path is then formed from the drive power supply (+) to the positive-bias-side switching device, the negative-bias-side capacitor, the free wheel diode of the second switching device, the inductor, the control terminal and the potential reference output terminal of the drive-target switching device, and the drive power supply (−). A current flowing through the inductor charges the control terminal of the drive-target switching device to increase the potential at the control terminal. The drive-target switching device transitions to a turn-on state.

When the potential Vgs at the control terminal increases and becomes higher than VG, a circulating current flows through a path of the inductor, the free wheel diode of the third switching device, the positive-bias-side switching device, the negative-bias-side capacitor, the free wheel diode of the second switching device, and the inductor. Accordingly, the potential Vgs of the control terminal is clamped at the power supply voltage VG. (4) The positive-bias-side switching device turns off and the third switching device turns on to form a path similar to the path (4) according to aspect 9.

(7) The second and third switching devices turn off. A path is then formed from the control terminal of the drive-target switching device to the inductor, the free wheel diode of the first switching device, the positive-bias-side capacitor, the negative-bias-side switching device, and the potential reference output terminal of the drive-target switching device. A current flowing through the inductor discharges the control terminal of the drive-target switching device to decrease the potential of the control terminal. The drive-target switching device transitions to a turn-off state.

When the potential Vgs at the control terminal decreases and becomes lower than the potential of the drive power supply (−), a circulating current flows through a path of the inductor, the free wheel diode of the first switching device, the positive-bias-side capacitor, the negative-bias-side switching device, the free wheel diode of the fourth switching device, and the inductor. Accordingly, the potential Vgs of the control terminal is clamped at the potential of the drive power supply (−). In this state, (8) the negative-bias-side switching device turns off and the fourth switching device turns on to form a path similar to the path (8) according to aspect 9.

In the semiconductor switching device drive circuit according to aspect 12, the energization control circuit forms the energizing path (4) and then forms the energizing path (5) before lapse of time to zero a current flowing through the inductor. As a result, the time to charge the negative-bias-side capacitor becomes longer. The energization control circuit forms the energizing path (8) and then turns on the negative-bias-side switching device before lapse of time to zero a current flowing through the inductor. The time to charge the positive-bias-side capacitor becomes longer than aspect 11. Terminal voltages of the positive-bias-side and negative-bias-side capacitors can be further increased.

In the semiconductor switching device drive circuit according to aspect 13, the energization control circuit adjusts terminal voltages of the positive-bias-side and negative-bias-side capacitors by adjusting a period length from turning off the positive-bias-side switching device in the energizing path (4) to turning on the positive-bias-side switching device in the energizing path (5) and a period length from turning off the negative-bias-side switching device in the energizing path (8) to turning on the negative-bias-side switching device in the energizing path (1) as a next operation. Terminal voltages of the positive-bias-side and negative-bias-side capacitors can be controlled to be further increased or to remain constant.

The semiconductor switching device drive circuit according to aspect 14 switches between a pattern of forming the first to eighth energizing paths (1) to (8) and another pattern containing the same paths except the energizing paths (3), (4), (7), and (8) replaced by energizing paths (3)', (4)', (7)', and (8)'. The energizing paths (3)', (4)', (7)', and (8)' equal to the energizing paths (3), (4), (7), and (8) in aspect 11, respectively. That is, aspect 14 switches between the pattern for forming the first to eighth energizing paths (1) to (8) according to aspect 10 and the pattern for forming the first to eighth energizing paths (1) to (8) according to aspect 11. The pattern switching signifies alternately implementing the former and the latter once or more. Both may or may not be implemented for the same number of times successively. It may be conceivable to appropriately combine the pattern of a longer discharge period according to aspect 10 with the pattern of a longer charge period according to aspect 11. Terminal voltages of the positive-bias-side and negative-bias-side capacitors can be higher than the power supply voltage as needed. The terminal voltage can be adjusted so as to be constant.

In the semiconductor switching device drive circuit according to aspect 15, the energization control circuit forms the first to eighth energizing paths (1) to (8) by operating the positive-bias-side and negative-bias-side switching devices, and the first to fourth switching devices as follows. It is noted that, in the following, the other switching device(s) is assumed to be off unless the switching device(s) described as being on, and the switching device(s) are assumed to maintain one of on-state and off-state unless the switching device(s) is described as being one of turned off and turned on. The following describes differences from aspect 9. According to aspect 13, (4) the first switching device turns off and the third switching device turns on. A circulating current flows through a path of the inductor, the third switching device, the positive-bias-side switching device, the negative-bias-side capacitor, the free wheel diode of the second switching device, and the inductor. Therefore, the negative-bias-side capacitor is charged.

(5) The positive-bias-side switching device turns off and the positive-bias-side switching device turns on in order. When the positive-bias-side switching device turns off, a circulating current flows through a path of the inductor, the third switching device, the drive power supply, the negative-bias-side diode, the negative-bias-side capacitor, the free wheel diode of the second switching device, and the inductor. Also at this time, the negative-bias-side capacitor is charged. The current flowing through the capacitor becomes zero and then the positive-bias-side switching device turns on. This enables to form the subsequent path (2).

(8) The second switching device turns off, the fourth switching device turns on, and the negative-bias-side switching device turns off in order. When the second switching device turns off and the fourth switching device turns on, a circulating current flows through a path of the inductor, the free wheel diode of the first switching device, the positive-bias-side capacitor, the negative-bias-side switching device, and the fourth switching device. The positive-bias-side capacitor is charged. When the negative-bias-side switching device turns off thereafter, a circulating current flows through a path of the inductor, the free wheel diode of the first switching device, the positive-bias-side capacitor, the positive-bias-side diode, the drive power supply, the fourth switching device, and the inductor. Also at this time, the positive-bias-side capacitor is charged. Terminal voltages of the positive-bias-side and negative-bias-side capacitors can be further increased.

In the semiconductor switching device drive circuit according to aspect 16, the semiconductor switching device drive circuit adjusts terminal voltages of the positive-bias-side and negative-bias-side capacitors by adjusting a period length from turning off the positive-bias-side switching device to turning on the positive-bias-side switching device in the energizing path (5) and a period length from turning off the negative-bias-side switching device in the energizing path (8) to turning on the negative-bias-side switching device in the energizing path (1) as a next operation. Terminal voltages of the positive-bias-side and negative-bias-side capacitors can be controlled to be further increased or to remain constant.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A semiconductor switching device drive circuit comprising:
    a drive power supply configured to apply a drive voltage between a potential reference output terminal of a drive-target switching device and a control terminal of the drive-target switching device;
    a positive-bias-side series circuit including a positive-bias-side switching device and a positive-bias-side diode having an anode, the anode being a common connection point connected to a positive-bias-side terminal of the drive power supply;
    a negative-bias-side series circuit including a negative-bias-side switching device and a negative-bias-side diode having a cathode, the cathode being a common connection point connected to a negative-bias-side terminal of the drive power supply;
    a positive-bias-side capacitor connected in parallel with the positive-bias-side series circuit;
    a negative-bias-side capacitor connected in parallel with the negative-bias-side series circuit;
    an inductor connected to the control terminal of the drive-target switching device; and
    an energization control circuit including first to fourth energization switching devices each connected to the inductor at one end and each having a free wheel diode connected in parallel in a direction opposite to a polarity of the drive power supply,
    wherein the energization control circuit is configured to control the first to fourth energization switching devices and the positive-bias-side and negative-bias-side switching devices thereby to form:
    a first path that charges the positive-bias-side capacitor;
    a second path that connects the drive power supply with the positive-bias-side capacitor in series and energizes the inductor in a direction to charge the control terminal of the drive-target switching device;
    a third path that charges the control terminal of the drive-target switching device using an electromagnetic energy stored in the inductor;
    a fourth path that applies a circulating current to the drive power supply when a potential of the control terminal becomes higher than a voltage of the drive power supply;
    a fifth path that charges the negative-bias-side capacitor;
    a sixth path that connects the drive power supply with the negative-bias-side capacitor in series and energizes the inductor in a direction to discharge the control terminal of the drive-target switching device;
    a seventh path that discharges the control terminal of the drive-target switching device using an electromagnetic energy stored in the inductor; and
    an eighth path that applies a circulating current to the drive power supply when potential of the control terminal becomes lower than potential at a negative-bias-side terminal of the drive power supply.

2. The semiconductor switching device drive circuit according to claim 1,
    wherein the first and second switching devices are connected in series between a cathode of the positive-bias-side diode and an anode of the negative-bias-side diode,
    wherein the third and fourth switching devices are connected in series between the positive-bias-side capacitor and the negative-bias-side capacitor and have a common connection point connected to the control terminal of the drive-target switching device, and wherein the inductor is connected between a common connection point of the first and second switching devices and the common connection point of the third and fourth switching devices.

3. The semiconductor switching device drive circuit according to claim 2,
wherein the energization control circuit is further configured to form the first to eighth paths by operating the positive-bias-side and negative-bias-side switching devices and the first to fourth switching devices as follows in order:
to set an initial state in which:
the first to third switching devices turn off;
the positive-bias-side and negative-bias-side switching devices and the fourth switching device turn on; and
the drive-target switching device turns off;
to form the first path by causing the positive-bias-side switching device to turn off and by causing the third switching device to turn on in order;
to form the second path by causing the third switching device to turn off, by causing the positive-bias-side switching device to turn on, and by causing the first switching device to turn on in order;
to form the third path by causing the fourth switching device to turn off;
to form the fourth path by causing the first switching device to turn off and by causing the third switching device to turn on;
to form the fifth path by causing the negative-bias-side switching device to turn off and by causing the fourth switching device to turn on in order;
to form the sixth path by causing the fourth switching device to turn off, by causing the negative-bias-side switching device to turn on, and by causing the second switching device to turn on in order;
to form the seventh path by causing the third switching device to turn off; and
to form the eighth path by causing the second switching device to turn off and by causing the fourth switching device to turn on.

4. The semiconductor switching device drive circuit according to claim 2,
wherein the energization control circuit is further configured to form the first to eighth paths by operating the positive-bias-side and negative-bias-side switching devices and the first to fourth switching devices as follows in order:
to set an initial state in which:
the first to third switching devices turn off;
the positive-bias-side and negative-bias-side switching devices and the fourth switching device turn on; and
the drive-target switching device turns off;
to form the first path by causing the positive-bias-side switching device to turn off and by causing the third switching device to turn on in order;
to form the second path by causing the third switching device to turn off, by causing the positive-bias-side switching device to turn on, and by causing the first switching device to turn on in order;
to form the third path by causing the first and fourth switching devices to turn off;
to form the fourth path by causing the third switching device to turn on;
to form the fifth path by causing the negative-bias-side switching device to turn off and by causing the fourth switching device to turn on in order;
to form the sixth path by causing the fourth switching device to turn off, by causing the negative-bias-side switching device to turn on, and by causing the second switching device to turn on in order;
to form the seventh path by causing the second and third switching devices to turn off; and
to form the eighth path by causing the fourth switching device to turn on.

5. The semiconductor switching device drive circuit according to claim 2,
wherein the energization control circuit is further configured to adjust terminal voltages of the positive-bias-side and negative-bias-side capacitors by operating the positive-bias-side and negative-bias-side switching devices and the first to fourth switching devices as follows in order:
to set an initial state in which:
the first to third switching devices turn off;
the positive-bias-side and negative-bias-side switching devices and the fourth switching device turn on; and
the drive-target switching device turns off;
to form the first path by causing the positive-bias-side switching device to turn off and by causing the third switching device to turn on in order;
to form the second path by causing the third switching device to turn off, by causing the positive-bias-side switching device to turn on, and by causing the first switching device to turn on in order;
to form a modified third path by causing the first and fourth switching devices to turn off;
to form a modified fourth path by causing the third switching device to turn on;
to form the fifth path by causing the negative-bias-side switching device to turn off and by causing the fourth switching device to turn on in order;
to form the sixth path by causing the fourth switching device to turn off, by causing the negative-bias-side switching device to turn on, and by causing the second switching device to turn on in order;
to form a modified seventh path by causing the second and third switching device to turn off; and
to form a modified eighth path by causing the fourth switching device to turn on.

6. The semiconductor switching device drive circuit according to claim 2,
wherein the energization control circuit is further configured to form the first to eighth paths by operating the positive-bias-side and negative-bias-side switching devices and the first to fourth switching devices as follows in order:
to set an initial state in which:
the first to third switching devices turn off;
the positive-bias-side and negative-bias-side switching devices and the fourth switching device turn on; and
the drive-target switching device turns off;
to form the first path by causing the positive-bias-side switching device to turn off and by causing the third switching device to turn on in order;
to form the second path by causing the third switching device to turn off, by causing the positive-bias-side switching device to turn on, and by causing the first switching device to turn on in order;
to form the third path by causing the fourth switching device to turn off;
to form the fourth path by causing the first switching device to turn off and by causing the third switching device to turn on in order;

to form the fifth path by causing the negative-bias-side switching device to turn off and by causing the fourth switching device to turn on in order;
to form the sixth path by causing the fourth switching device to turn off, by causing the negative-bias-side switching device to turn on, and by causing the second switching device to turn on in order;
to form the seventh path by causing the third switching device to turn off; and
to form the eighth path by causing the second switching device to turn off and by causing the fourth switching device to turn on in order.

7. The semiconductor switching device drive circuit according to claim 6,
wherein the energization control circuit is further configured to adjust terminal voltages of the positive-bias-side and negative-bias-side capacitors by adjusting:
a period length from forming the third path to turn off the first switching device in the fourth path; and
a period length from forming the seventh path to turn off the second switching device in the eighth path.

8. The semiconductor switching device drive circuit according to claim 1,
wherein the positive-bias-side capacitor and the negative-bias-side capacitor are connected in series;
wherein the energization control circuit includes:
a series circuit that is connected in parallel with the positive-bias-side and negative-bias-side capacitors and includes the first and second switching devices; and
a series circuit that is connected in parallel with the drive power supply and includes the third and fourth switching devices; and
wherein the inductor is connected between a common connection point of the first and second switching devices and a common connection point of the third and fourth switching devices.

9. The semiconductor switching device drive circuit according to claim 8,
wherein the energization control circuit is further configured to form the fifth path before forming the second path and to form the second path before forming the sixth path.

10. The semiconductor switching device drive circuit according to claim 9,
wherein the energization control circuit is further configured to form the first to eighth paths by operating the positive-bias-side and negative-bias-side switching devices and the first to fourth switching devices as follows in order:
to set an initial state in which:
the first to third switching devices turn off;
the positive-bias-side and negative-bias-side switching devices turn off;
the fourth switching device turns on; and
the drive-target switching device turns off;
to form the first path by causing the negative-bias-side switching device to turn on;
to form the fifth path by causing the negative-bias-side switching device to turn off and by causing the positive-bias-side switching device to turn on in order;
to form the second path by causing the first switching device to turn on;
to form the third path by causing the fourth switching device to turn off;
to form the fourth path by causing the positive-bias-side switching device and the first switching device to turn off and by causing the third switching device to turn on;
to form the fifth path by causing the positive-bias-side switching device to turn on;
to form the second path by causing the positive-bias-side switching device to turn off and by causing the negative-bias-side switching device to turn on in order;
to form the sixth path by causing the second switching device to turn on;
to form the seventh path by causing the third switching device to turn off; and
to form the eighth path by causing the negative-bias-side switching device and the second switching device to turn off and by causing the fourth switching device to turn on.

11. The semiconductor switching device drive circuit according to claim 9,
wherein the energization control circuit is further configured to form the first to eighth paths by operating the positive-bias-side and negative-bias-side switching devices and the first to fourth switching devices as follows in order:
to set an initial state in which:
the first to third switching devices turn off;
the positive-bias-side and negative-bias-side switching devices turn off;
the fourth switching device turns on; and
the drive-target switching device turns off;
to form the first path by causing the negative-bias-side switching device to turn on;
to form the fifth path by causing the negative-bias-side switching device to turn off and by causing the positive-bias-side switching device to turn on in order;
to form the second path by causing the first switching device to turn on;
to form the third path by causing the first and fourth switching devices turn off;
to form the fourth path by causing the positive-bias-side switching device to turn off and by causing the third switching device to turn on;
to form the fifth path by causing the positive-bias-side switching device to turn on;
to form the second path by causing the positive-bias-side switching device to turn off and by causing the negative-bias-side switching device to turn on in order;
to form the sixth path by causing the second switching device to turn on;
to form the seventh path by causing the second and third switching devices to turn off; and
to form the eighth path by causing the negative-bias-side switching device to turn off and by causing the fourth switching device to turn on.

12. The semiconductor switching device drive circuit according to claim 11,
wherein the energization control circuit is further configured to form the fourth path and then to form the fifth path before lapse of time to zero a current flowing through the inductor, and
wherein the energization control circuit is further configured to form the eighth path and then to turn on the negative-bias-side switching device before lapse of time to zero a current flowing through the inductor.

13. The semiconductor switching device drive circuit according to claim 9,
wherein the energization control circuit is further configured to adjust terminal voltages of the positive-bias-side and negative-bias-side capacitors by adjusting a period length from turning off the positive-bias-side switching device in the fourth path to turning on the positive-bias-side switching device in the fifth path and a period length from turning off the negative-bias-side switching device in the eighth path to turning on the negative-bias-side switching device in the first path as a next operation.

14. The semiconductor switching device drive circuit according to claim 9,
wherein the energization control circuit is further configured to adjust terminal voltages of the positive-bias-side and negative-bias-side capacitors by operating the positive-bias-side and negative-bias-side switching devices and the first to fourth switching devices as follows in order:
to set an initial state in which:
the first to third switching devices turn off;
the positive-bias-side and negative-bias-side switching devices turn off;
the fourth switching device turns on; and
the drive-target switching device turns off;
to form the first path by causing the negative-bias-side switching device to turn on;
to form the fifth path by causing the negative-bias-side switching device to turn off and by causing the positive-bias-side switching device to turn on in order;
to form the second path by causing the first switching device to turn on;
to form a modified third path by causing the first and fourth switching devices to turn off;
to form a modified fourth path by causing the positive-bias-side switching device to turn off and by causing the third switching device to turn on;
to form the fifth path by causing the positive-bias-side switching device to turn on;
to form the second path by causing the positive-bias-side switching device to turn off and by causing the negative-bias-side switching device to turn on in order;
to form the sixth path by causing the second switching device to turn on;
to form a modified seventh path by causing the second and third switching devices to turn off; and
to form a modified eighth path by causing the negative-bias-side switching device to turn off and by causing the fourth switching device to turn on.

15. The semiconductor switching device drive circuit according to claim 9,
wherein the energization control circuit is further configured to form the first to eighth paths by operating the positive-bias-side and negative-bias-side switching devices and the first to fourth switching devices as follows in order:
to set an initial state in which:
the first to third switching devices turn off;
the positive-bias-side and negative-bias-side switching devices turn off;
the fourth switching device turns on; and
the drive-target switching device turns off;
to form the first path by causing the negative-bias-side switching device to turn on;
to form the fifth path by causing the negative-bias-side switching device to turn off and by causing the positive-bias-side switching device to turn on in order;
to form the second path by causing the first switching device to turn on;
to form the third path by causing the fourth switching device to turn off;
to form the fourth path by causing the first switching device to turn off and by causing the third switching device to turn on;
to form the fifth path by causing the positive-bias-side switching device to turn off and by causing the positive-bias-side switching device to turn on in order;
to form the second path by causing the positive-bias-side switching device to turn off and by causing the negative-bias-side switching device to turn on in order;
to form the sixth path by causing the second switching device to turn on;
to form the seventh path by causing the third switching device to turn off; and
to form the eighth path by causing the second switching device to turn off, by causing the fourth switching device to turn on, and by causing the negative-bias-side switching device to turn off in order.

16. The semiconductor switching device drive circuit according to claim 15,
wherein the energization control circuit is configured to adjust terminal voltages of the positive-bias-side and negative-bias-side capacitors by adjusting:
a period length from turning off the positive-bias-side switching device to turning on the positive-bias-side switching device in the fifth path; and
a period length from turning off the negative-bias-side switching device in the eighth path to turning on the negative-bias-side switching device in the first path as a next operation.

* * * * *